(12) United States Patent
Pan et al.

(10) Patent No.: US 9,928,914 B2
(45) Date of Patent: *Mar. 27, 2018

(54) METHODS AND APPARATUS TO READ MEMORY CELLS BASED ON CLOCK PULSE COUNTS

(71) Applicant: Intel Corporation, Santa Clara, CA (US)

(72) Inventors: Feng Pan, Fremont, CA (US); Ramin Ghodsi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/491,708

(22) Filed: Apr. 19, 2017

(65) Prior Publication Data

US 2017/0221568 A1 Aug. 3, 2017

Related U.S. Application Data

(63) Continuation of application No. 15/347,571, filed on Nov. 9, 2016, now Pat. No. 9,659,613, which is a continuation of application No. 14/952,322, filed on Nov. 25, 2015, now Pat. No. 9,530,513.

(51) Int. Cl.
*G11C 16/10* (2006.01)
*G11C 16/34* (2006.01)
*G11C 11/56* (2006.01)
*G11C 7/22* (2006.01)

(52) U.S. Cl.
CPC .......... *G11C 16/10* (2013.01); *G11C 7/22* (2013.01); *G11C 11/5628* (2013.01); *G11C 16/349* (2013.01); *G11C 16/3454* (2013.01); *G11C 16/3459* (2013.01)

(58) Field of Classification Search
CPC ........................................................ G11C 7/22
USPC ........................ 365/189.15, 189.05, 194
See application file for complete search history.

(56) References Cited

U.S. PATENT DOCUMENTS

| | | | |
|---|---|---|---|
| 5,881,007 | A | 3/1999 | Jeong et al. |
| 6,317,375 | B1 | 11/2001 | Perner |
| 6,714,449 | B2 | 3/2004 | Khalid |
| 6,795,359 | B1 | 9/2004 | Baker |
| 6,870,784 | B2 | 3/2005 | Baker |
| 6,906,951 | B2 | 6/2005 | Wong |

(Continued)

OTHER PUBLICATIONS

Patent Cooperation Treaty, "International Search Report," issued in connection with PCT Application No. PCT/US2016/054448, dated Jan. 12, 2017, 3 pages.

(Continued)

*Primary Examiner* — Hoai V Ho
*Assistant Examiner* — Jay Radke
(74) *Attorney, Agent, or Firm* — Hanley, Flight and Zimmerman, LLC

(57) ABSTRACT

A disclosed example determines programmed states of a plurality of memory cells based on a counter reaching a trigger count value, the trigger count value selected from a plurality of different trigger count values based on a characteristic of the memory cells; determines, based on the programmed states, first ones of the memory cells that do not satisfy a target threshold voltage; and performs the programming pass on the first ones of the memory cells.

45 Claims, 12 Drawing Sheets

(56) References Cited

U.S. PATENT DOCUMENTS

| | | | |
|---|---|---|---|
| 7,489,563 | B2 | 2/2009 | Richter et al. |
| 8,289,779 | B2 | 10/2012 | Hoei |
| 8,782,474 | B2 | 7/2014 | Koudele et al. |
| 9,001,608 | B1 | 4/2015 | Chishti et al. |
| 9,530,513 | B1 * | 12/2016 | Pan ........................ G11C 16/32 |
| 9,659,613 | B1 * | 5/2017 | Pan ........................ G11C 16/32 |
| 2002/0012280 | A1 * | 1/2002 | Yamamoto ............... G11C 7/14 |
| | | | 365/200 |
| 2003/0058727 | A1 | 3/2003 | Tanizaki et al. |
| 2003/0189870 | A1 | 10/2003 | Wilcox |
| 2007/0159903 | A1 | 7/2007 | Kim et al. |
| 2013/0318422 | A1 | 11/2013 | Weathers et al. |
| 2016/0117216 | A1 | 4/2016 | Muchherla et al. |

OTHER PUBLICATIONS

Patent Cooperation Treaty, "Written Opinion," issued in connection with PCT Application No. PCT/US2016/054448, dated Jan. 12, 2017, 8 pages.

United States Patent and Trademark Office, "Notice of Allowance," issued in connection with U.S. Appl. No. 15/347,571, dated Jan. 9, 2017, 8 pages.

United States Patent and Trademark Office, "Non-final Office Action," issued in connection with U.S. Appl. No. 14/952,322, dated Apr. 13, 2016, 15 pages.

United States Patent and Trademark Office, "Notice of Allowance," issued in connection with U.S. Appl. No. 14/952,322, dated Aug. 12, 2016, 17 pages.

* cited by examiner

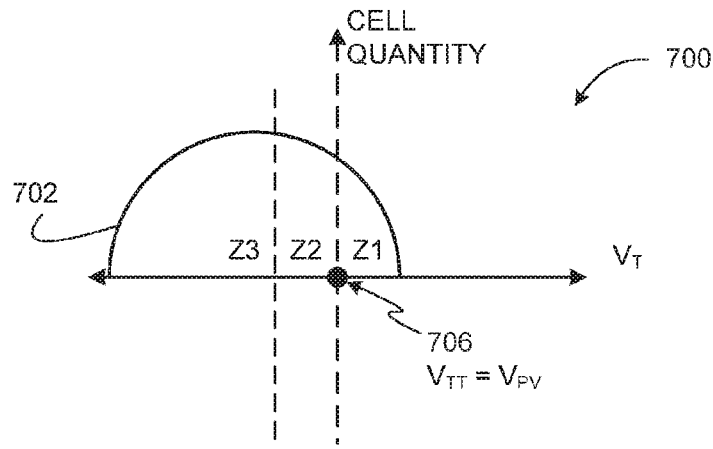
PROGRAMMED STATES OF TARGET MEMORY CELLS
FIG. 7A
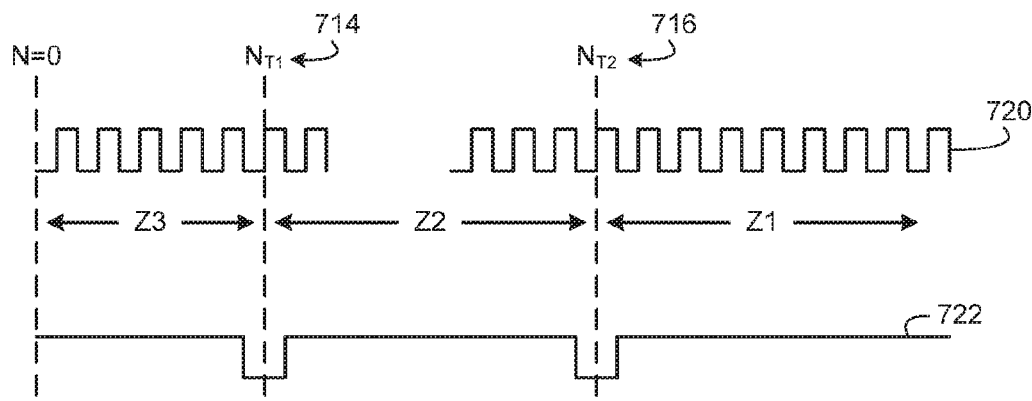
COUNTER-BASED ACQUISITION OF PROGRAMMED STATES OF
TARGET MEMORY CELLS
FIG. 7B
| ZONE | Z3 | Z2 | Z1 |
|---|---|---|---|
| PROGRAM PULSE-TYPE | PGM | SSPC | INH |
PROGRAM PULSE-TYPE TABLE
FIG. 7C

SOFT BIT INFORMATION OF MEMORY CELLS

PULSE COUNT-BASED SOFT BIT EXTRACTION OF MEMORY CELLS

METHODS AND APPARATUS TO READ MEMORY CELLS BASED ON CLOCK PULSE COUNTS

RELATED APPLICATIONS

This patent arises from a continuation of U.S. patent application Ser. No. 15/347,571, filed on Nov. 9, 2016, which is a continuation of U.S. patent application Ser. No. 14/952,322, filed on Nov. 25, 2015, now U.S. Pat. No. 9,530,513, all of which are hereby incorporated herein by reference in their entireties.

FIELD OF THE DISCLOSURE

The present disclosure relates generally to memory devices and, more particularly, to methods and apparatus to read memory cells based on clock pulse counts.

BACKGROUND

Nonvolatile memory devices are capable of persisting data for extended periods of time without needing to be powered to maintain such data storage. For example, information is written to a nonvolatile flash memory device by changing the electrical characteristics of transistor-based memory cells of the flash memory device to change how such memory cells react to applied voltages. The electrical characteristics of different memory cells in a semiconductor memory device are representative of binary bits that can be read by sensing threshold voltages of the memory cells in response to applied input voltages.

A threshold voltage of a memory cell is the gate-to-source voltage of the memory cell's transistor necessary to allow electrical current to conduct through the source and drain terminals of the transistor. To sense the flow of electrical current and, thus, the threshold voltages of memory cells in a flash memory device, the flash memory device is provided with sense amplifiers in circuit with columns of the memory cells. In this manner, the sense amplifiers can be used to latch logical values corresponding to the electrical current flowing through the memory cells. The latched logical values can then be processed to determine threshold voltages of memory cells. In turn, the threshold voltages are indicative of different binary bit values stored in the memory cells. Such sensing operations can be used to read programmed states of the memory cells during program-verify operations used to confirm whether intended information (e.g., data) is fully written to memory cells during write operations. Sensing operations are also used during normal read operations of the memory cells that can be performed one or more times after information is successfully written to the memory cells.

BRIEF DESCRIPTION OF THE DRAWINGS

FIG. 7A is a programmed states graph showing observed programmed states of target memory cells.

FIG. 7B depicts counter-based triggers to acquire the programmed states of target memory cells shown in the programmed states graph of FIG. 7A.

FIG. 7C is an example program pulse-type table showing types of program pulses needed for programming corresponding target memory cells to reach a target threshold voltage ($V_{TT}$) during a memory cell programming process.

DETAILED DESCRIPTION

Figure 1:
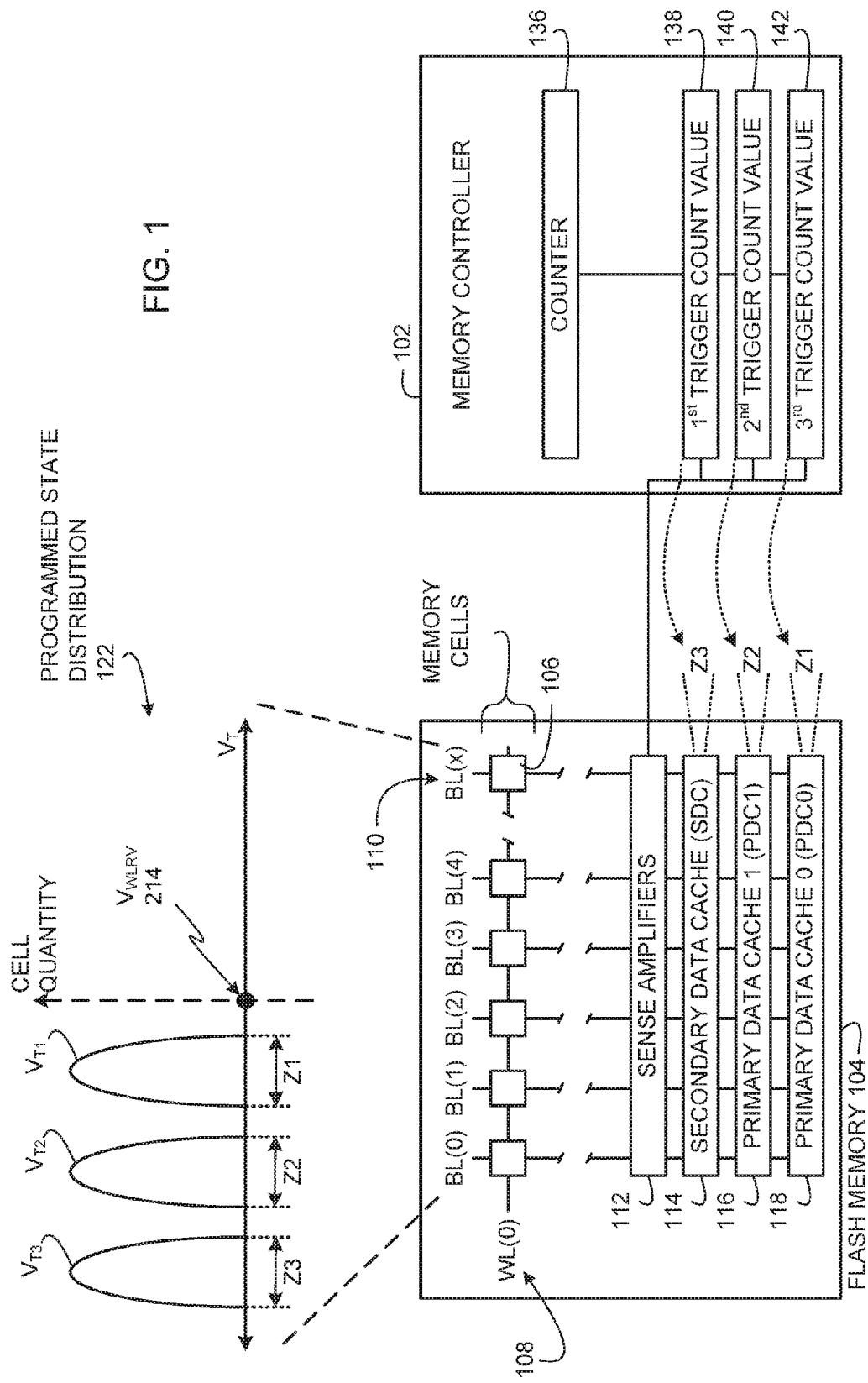
FIG. 1 is an example memory controller that can be implemented in accordance with the teachings of this disclosure to perform read operations on an example flash memory based on clock pulse counts.

Examples disclosed herein may be used to read programmed states of memory cells in semiconductor memory devices based on clock pulse counts. Programmed states represent information stored in memory cells. Many semiconductor memory devices store information based on changes to electrical properties of memory cells. In some semiconductor memory devices, such changes to electrical properties change electrical currents through memory cells to represent different stored information. Examples disclosed herein sense programmed states of memory cells based on relationships between time and electrical current flow through the memory cells. For example, an integrating capacitor is used to develop a charge based on the electrical current through a memory cell. Examples disclosed herein use clock pulse counts to track an amount of capacitor integration time that elapses during the charging of the capacitor. In this manner, the number of clock pulses that elapse can be used to determine the programmed state of the memory cell.

Capacitor integration time refers to the storage of energy in a capacitor as the capacitor builds charge over time based on the amount of electrical current that flows through the capacitor. Capacitor integration time is directly proportional to electrical current. For example, higher amounts of electrical current flowing through a capacitor result in lower capacitor integration time because the larger electrical current will cause the capacitor to develop a charge faster than if the electrical current were lower. Examples disclosed herein use clock pulse counts as measures of time to determine how fast electrical currents develop charges on integrating capacitors of corresponding memory cells in semiconductor memory devices. In this manner, examples disclosed herein can determine memory cell programmed states by observing electrical currents flowing through memory cells based on clock pulse counts.

Examples disclosed herein may be used in connection with any type of memory device in which different amounts of electrical current that flow through memory cells are representative of programmed states of those memory cells. For example, in a flash memory device, memory cell transistors are programmed to different threshold voltages to represent different programmed states. In a flash memory cell, a transistor is the electronic component that stores information (e.g., one or more binary bits of data). The memory cell may be programmed during a memory cell programming phase to store data by using one or more programming pulses to change an electron charge on a floating gate of the memory cell transistor. For example, changing the electron charge on the floating gate changes the programmed threshold voltage ($V_T$) of the memory cell transistor, which affects the amount of electrical current flow between the drain and source terminals of the memory cell transistor when the gate terminal of the memory cell transistor is under a fixed gate bias voltage. As such, the voltage separation between the resulting programmed threshold voltage ($V_T$) and the fixed gate bias voltage during a read operation is directly proportional to the amount of electrical current flow through the memory cell which is, in turn, representative of the programmed state of that memory cell. Thus, different information can be stored in memory cells by using one or more programming passes during a programming phase to change the floating gate electron charge of memory cell transistors. Similar programming techniques may be used to store information in other types of semiconductor memories. For example, other memory types that use non-linear electronic components such as transistors or linear electronic components such as resistance-based components may also be programmed by changing the electrical properties of those components to store different information. Examples disclosed herein may be used in connection with any such memory types in which different amounts of electrical current that flow through those components are representative of corresponding stored information. In some examples, the teachings of this disclosure may be used to increase the programming and/or reading speeds of NAND flash and/or 3D NAND flash, and/or to improve solid state drive (SSD) performance.

To use clock pulse counts to sense programmed states of memory cells in semiconductor memories, examples disclosed herein use pulse count-to-electrical current techniques to operate sense amplifiers. For example, clock pulse counts are used to control the operations of sense amplifiers to extract threshold voltage distributions at relatively higher speeds than prior threshold voltage distribution sensing techniques without needing to manipulate wordline or bitline voltage biasing to read stored information.

In flash memory devices, memory cells are addressed by activating wordlines (e.g., rows) and bitlines (e.g., columns) such that a memory cell is activated when it is at the intersection of an active wordline and an active bitline. The addressed memory cell can then be read or written. Memory cell read operations that are based on cycling or ramping through different wordline voltages to sense different threshold voltages ($V_T$) of memory cells require a significant amount of time due to extensive resistance-capacitance (RC) delay associated with cycling or ramping through the different wordline voltages.

In addition, when threshold voltages ($V_T$) of memory cells on precharged/activated bitlines are much less than transistor gate-to-source voltages ($V_T \ll V_{gs}$) used to activate a corresponding wordline, electrical current injected into the transistors of those memory cells discharges very quickly through their source (SRC) terminals into a SRC plate of the flash memory die. This rapid discharge is due to the significant voltage difference between the threshold voltages and the gate-to-source voltages ($V_T \ll V_{gs}$) of the memory cells. The rapid discharge into the SRC plate creates a SRC bounce which is the development of an undesired voltage bias on the SRC plate that is applied to all SRC terminals of memory cell transistors. As such, the undesired voltage bias affects subsequent threshold voltage readings of the memory cells using prior techniques by making those threshold voltage levels appear larger than what the electrical characteristics of the memory cells have been programmed to output.

Examples disclosed herein are useful to improve speeds and accuracies of reading programmed states of memory cells. For example, because examples disclosed herein trigger sense amplifiers based on clock pulse counts, a wordline voltage of activated memory cells can remain fixed while sensing a threshold voltage ($V_T$) distribution of the memory cells. Keeping such wordline voltages fixed increases the speeds with which programmed states of memory cells can be read because keeping the wordline voltage fixed decreases a wordline settling time to near a resistance-capacitance (RC) delay of the wordline for each discrete read/verify threshold voltage ($V_T$) level. For example, each time a different voltage is applied to a wordline to sense a different threshold voltage ($V_T$) using prior memory cell sensing techniques, additional time is required to settle the wordline to a steady-state at which threshold voltage ($V_T$) of those memory cells on that wordline can be sensed. By applying only a single fixed voltage to the wordline to sense a threshold voltages ($V_T$) distribution using clock pulse counts as disclosed herein, numerous lengthy settling times of prior techniques are eliminated so that numerous threshold voltages ($V_T$) can be sensed much quicker.

In some disclosed examples, programmed states of memory cells can be read with increased accuracy using examples disclosed herein by changing a sense time ($t_{sen}$) of a sense amplifier by selecting different pulse counts (N) at which to trigger the sense amplifier and/or by selecting different clock periods ($T_{clk}$) used to drive a counter that generates the pulse counts (N). For example, the clock period ($T_{clk}$) can be decreased to achieve higher resolution readings of memory cell programmed states. In addition, accuracy can be further increased by using second or third order linear relationships between pulse counts (N) and memory cell electrical current ($I_{CELL}$) for different voltage separations between gate-to-source voltage ($V_{gs}$) and threshold voltage ($V_T$) (e.g., $V_{gs}-V_T$).

FIG. 1 is an example memory controller 102 to perform program and read operations on an example flash memory 104. For example, the flash memory 104 includes a plurality of memory cells that are generally referred to herein using reference numeral 106. In the illustrated example, the memory cells 106 may be programmed to store information during a programming phase and may be subsequently read one or more times during read phases to read the stored information. During programming and/or read phases of some examples, one or more different ones of the memory cells 106 may be selectively activated to program information only in desired ones of the memory cells 106 and/or to read information from only desired ones of the memory cells 106. Selected ones of the memory cells 106 for programming and/or reading are referred to as target memory cells, and non-selected ones of the memory cells 106 are referred to as non-target memory cells.

The flash memory 104 of the illustrated example is a single-level cell (SLC) NAND flash memory that stores one binary bit value per memory cell 106. However, examples disclosed herein may be implemented in connection with NAND flash memories that store multiple bits per memory cell such as two-bit per cell (2 bpc) NAND flash memories (often referred to as multi-level cell (MLC) flash memories), 3 bpc NAND flash memories (often referred to as triple-level cell (TLC) flash memories), 4 bpc NAND flash memories (often referred to as quad-level cell (QLC) flash memories, or any other suitable types of memories that store any number of bits per cell. For example, examples disclosed herein may be used in connection with any type of memory in which different levels of electrical current that flow through memory cells of those memories are representative of corresponding information stored in the memory cells.

In the illustrated example, the memory controller 102 and the flash memory 104 may be integrated into a single flash memory integrated circuit (IC) package. For example, the memory controller 102 and the flash memory 104 may be on the same die and placed into the same IC package, or may be on separate die and bonded to one another in the same IC package. Alternatively, the memory controller 102 may be in a separate IC package from the flash memory 104.

In the illustrated example, the memory cells 106 are located in a same wordline (WL(0)) 108 (e.g., a row). Also in the illustrated example, each of the memory cells 106 is located on a corresponding bitline (BL) shown as BL(0) through BL(x) and generally referred to using reference numeral 110. Each of the memory cells 106 of the illustrated example is addressed by activating (e.g., applying a wordline read-verify voltage ($V_{WLRV}$) to) the wordline (WL(0)) 108 and precharging a corresponding one of the bitlines BL(0)-BL(x). The flash memory 104 of the illustrated example is provided with example sense amplifiers 112 to sense programmed states of the memory cells 106. For example, when the wordline (WL(0)) 108 and one or more bitlines BL(0)-BL(x) 110 are selected to activate one or more targeted ones of the memory cells 106, electrical currents flow through the target ones of the memory cells 106 based on the programmed threshold voltages ($V_T$) of those memory cells 106. The sense amplifiers 112 latch values based on those electrical currents to identify programmed states of the target ones of the memory cells 106. The flash memory 104 of the illustrated example is provided with example data caches including a secondary data cache (SDC) 114, a first primary data cache (PDC1) 116, and a second primary data cache (PDC2) 118. The data caches 114, 116, 118 are provided to store values latched by the sense amplifiers 112 corresponding to information stored in the memory cells 106. Although only three data caches 114, 116, 118 are shown in the illustrated example of FIG. 1, fewer or more data caches may be used in connection with examples disclosed herein to store binary values latched by the sense amplifiers 112 to determine programmed states of the memory cells 106.

In the illustrated example, information stored in the memory cells 106 is represented by an example programmed state distribution 122 showing that some of the memory cells 106 are programmed in a first threshold voltage ($V_{T1}$) distribution (e.g., 3.25 volts (V)+/−0.5V), some of the memory cells 106 are programmed in a second threshold voltage ($V_{T2}$) distribution (e.g., 2V, +/−0.5V), and some of the memory cells 106 are programmed in a third threshold voltage distribution ($V_{T3}$) distribution (e.g., 0.75V, +/−0.5V). Each of the threshold voltage distributions $V_{T1}$, $V_{T2}$, $V_{T3}$ of the illustrated example is shown as having lower and upper range boundaries (e.g., edges). As such, the example programmed state distribution 122 shows a number of the memory cells 106 that are programmed to be within the lower and upper voltage range boundaries of those threshold voltage distributions $V_{T1}$, $V_{T2}$, $V_{T3}$. In the illustrated example, each of the threshold voltage distributions $V_{T1}$, $V_{T2}$, $V_{T3}$ of the memory cells 106 is bound to a corresponding one of three programmed state zones Z1, Z2, Z3. For example, a first programmed state zone Z1 is bound by a lower voltage range boundary (e.g., 2.75V) and an upper voltage range boundary (e.g., 3.75V) of the first threshold voltage distribution $V_{T1}$. The second programmed state zone Z2 of the illustrated example is bound by a lower voltage range boundary (e.g., 1.5V) and an upper voltage range boundary (2.5V) of the second threshold voltage distribution $V_{T2}$. The third programmed state zone Z3 of the illustrated example is bound by a lower voltage range boundary (e.g., 0.25V) and an upper voltage range boundary (e.g., 1.25V) of the third threshold voltage distribution $V_{T3}$. The threshold voltage distributions $V_{T1}$, $V_{T2}$, $V_{T3}$ of the illustrated example are shown relative to a fixed gate bias voltage referred to as a wordline read-verify voltage ($V_{WLRV}$) (e.g., a $V_{WLRV}$ 214 of FIG. 2). As such, each of the example threshold voltage distributions $V_{T1}$, $V_{T2}$, $V_{T3}$ is shown as having a different voltage separation from, or voltage proximity to, the wordline read-verify voltage ($V_{WLRV}$) 214.

The memory controller 102 of the illustrated example includes a duration tracker in the form of an example counter 136. The example memory controller 102 also includes trigger values (e.g., duration-based trigger values) in the form of example trigger count values 138, 140, 142. In the illustrated example, the trigger count values 138, 140, 142 are used to trigger the sense amplifiers 112 to latch values corresponding to programmed states of one or more of the memory cells 106 based on electrical current that flows through the one or more of the memory cells 106. For example, when targeted ones of the memory cells 106 are activated, the counter 136 starts accumulating a count value representative of an elapsed duration based on a clock input. When the example counter 136 reaches one of the example trigger count values 138, 140, 142, the memory controller 102 triggers the sense amplifiers 112 to latch values corresponding to the programmed states of the targeted ones of the memory cells 106. Although three trigger count values 138, 140, 142 are shown in the illustrated example, in other examples, fewer or more trigger count values may be used.

In the illustrated example, the trigger count values 138, 140, 142 are used to determine the distribution of memory cells across the three programmed state zones Z1, Z2, Z3 shown in the programmed state distribution 122. For example, the first trigger count value 138 can be used to detect ones of the memory cells 106 in the third programmed state Z3, the second trigger count value 140 can be used to detect ones of the memory cells 106 in the second programmed state Z2, and the third trigger count value 142 can be used to detect ones of the memory cells 106 in the third programmed state Z3. That is, in the illustrated example, the different trigger count values 138, 140, 142 cause triggering of the sense amplifiers 112 at different times. Such different trigger times allow electrical currents that flow through the memory cells 106 to develop charges on corresponding integrating capacitors (e.g., the integrating capacitor ($C_{INT}$) 602 of FIG. 6) in the sense amplifiers 112. The example sense amplifiers 112 then latch binary values for different ones of the memory cells 106 depending on when corresponding integrating capacitors develop sufficient charge to exceed a trip voltage level of the sense amplifiers 112. In the illustrated example, the amounts of energy stored in the integrating capacitors create voltages across the integrating capacitors of similarly or identically programmed ones of the memory cells 106 (e.g., ones of the memory cells having the same programmed threshold voltage ($V_T$)) to trip corresponding ones of the sense amplifiers 112 after a same duration of time that is based on a same programmed threshold voltages ($V_T$) of the ones of the memory cells 106. That is, the similarly or identically programmed ones of the memory cells 106 exceed the trip voltage levels of the corresponding ones of the sense amplifiers 112 at the same time because they are programmed to the same threshold voltage ($V_T$). Also in the illustrated example, for ones of the memory cells 106 programmed to different threshold voltages ($V_T$), the amounts of energy stored in the integrating capacitors create voltages across the integrating capacitors of those differently programmed memory cells 106 (e.g., ones of the memory cells having different programmed threshold voltages ($V_T$)) to trip corresponding ones of the sense amplifiers 112 after different durations of time based on their corresponding ones of the different programmed threshold voltages ($V_T$). That is, differently programmed ones of the memory cells 106 exceed the trip voltage levels of the corresponding ones of the sense amplifiers 112 at different times because they are programmed to the different threshold voltages ($V_T$). In the illustrated example, the sense amplifiers 112 latch a binary '1' for programmed threshold voltage levels ($V_T$) above the sense amplifier trip voltage level, and latch a binary '0' for programmed threshold voltage levels ($V_T$) below the sense amplifier trip voltage level.

In the illustrated example, the sense amplifier trip timing range is set to a time range that is more than enough for voltages developed across integrating capacitors to trip the sense amplifiers 112 for the highest threshold voltage ($V_T$) to be measured. For example, in the programmed state distribution 122, the highest threshold voltage ($V_T$) being measured is the first threshold voltage ($V_{T1}$). In addition, a wordline read-verify voltage ($V_{WLRV}$) applied to the wordline 108 during a read operation is slightly more (e.g., 100~500 mV more) than the highest threshold voltage ($V_T$) to be measured (e.g., the first threshold voltage level ($V_{T1}$) in the programmed state distribution 122). As such, when the wordline 108 is activated using the wordline read-verify voltage ($V_{WLRV}$), ones of the memory cells 106 having relatively lower threshold voltages (e.g., the third threshold voltage ($V_{T3}$)) will have the largest electrical current flow due to the relatively large separation between the low threshold voltages of those memory cells 106 and the relatively larger wordline read-verify voltage ($V_{WLRV}$) applied to the wordline 108. In addition, ones of the memory cell 106 having the largest threshold voltages (e.g., the first threshold voltage ($V_{T1}$)) will have the smallest electrical current flow due to the relatively small separation between the large threshold voltages of those memory cells 106 and the wordline read-verify voltage ($V_{WLRV}$) applied to the wordline 108.

The different amounts of electrical current through different ones of the memory cells 106 under a fixed wordline read-verify voltage (VWLRV) (e.g., a fixed gate bias voltage) cause charges on corresponding integrating capacitors of the sense amplifiers 112 to develop at different rates. Such different rates of charge development on the integrating capacitors create time-based relationships between electrical current and programmed states of the memory cells 106. Examples disclosed herein use such time-based relationships to sense the programmed states of the memory cells 106. For example, the different trigger count values 138, 140, 142 represent different amounts of time during which electrical currents flow through the bitlines (BL(x)) 110 between the memory cells 106 and corresponding integrating capacitors in the sense amplifiers 112. As such, the example memory controller 102 uses the different trigger count values 138, 140, 142 to trigger the sense amplifiers 112 to latch binary values for corresponding ones of the memory cells 106 at different times such that binary ones will be latched in the sense amplifiers 112 when sufficient time has elapsed for corresponding electrical currents to develop sufficient voltage on the integrating capacitors to exceed the trip voltage level of the sense amplifiers 112. In the illustrated example, outputs of the sense amplifiers 112 after different time intervals could be transferred to corresponding ones of the PDC0 118, the PDC1 116, or the SDC 114. In this manner, suitable logic operations could be performed on the sense amplifier output values after sensing operations to extract or determine the programmed states of the memory cells 106.

Using the time-based relationships between electrical current and programmed states of the memory cells 106, the memory controller 102 triggers the sense amplifiers 112 at a first time based on the counter 136 reaching the first trigger count value 138. This causes the sense amplifiers 112 to latch values corresponding to ones of the memory cells 106 having threshold voltages ($V_T$) in the third programmed state Z3 and to store the third programmed state Z3 latched values in the SDC 114. Also, the memory controller 102 triggers the sense amplifiers 112 at a second time based on the counter 136 reaching the second trigger count value 140. This causes the sense amplifiers 112 to latch values corresponding to ones of the memory cells 106 having threshold voltages ($V_T$) in the second programmed state Z2 and to latch the previous values of the ones of the memory cells 106 in the third programmed state Z3, and to store the second programmed state Z2 and third programmed state Z3 latched values in the PDC1 116. In addition, the memory controller 102 triggers the sense amplifiers 112 at a third time based on when the counter 136 reaches the third trigger count value 142. This causes the sense amplifiers 112 to latch values corresponding to ones of the memory cells 106 having threshold voltages ($V_T$) in the first programmed state Z1 and to latch the previous values of the ones of the memory cells 106 in the second and third programmed state Z2, Z3, and to store the first programmed state Z1, the second programmed state Z2, and the third programmed state Z3 latched values in the PDC0 118. In this manner, with logic circuits or functions to perform logic operations on the values stored in the SDC 114, the PDC1 116, and the PDC0 118, the memory controller 102 can determine the programmed states of the memory cells 106 based on the values latched by the sense amplifiers 112 at the different times corresponding to the trigger count values 138, 140, 142.

Although the illustrated example of FIG. 1 shows a duration tracker in the form of the counter 136 and although examples disclosed herein are described in connection with the counter 136, any type of duration tracker to track amounts of elapsed time may be used to cause the memory controller 102 to trigger the sense amplifiers 112 at different elapsed times based on different trigger values (e.g., duration-based trigger values) to sense programmed states of the memory cells 106. For example, if a duration tracker in the form of a timer is used instead of the counter 136, the trigger counter values 138, 140, 142 used to track elapsed time may instead be implemented using timer-based trigger values in the form of time values. In such examples, the memory controller 102 triggers the sense amplifiers 112 when amounts of elapsed time tracked by the timer satisfy the time values of the timer-based triggers. In yet other examples, any other type of duration tracker may be used to trigger the sense amplifiers 112. For example, the duration tracker may begin tracking elapsed time from a time at which memory cells 106 are activated to allow integrating capacitors to develop voltages corresponding to respective ones of the activated memory cells 106. In this manner, the memory controller 102 may use the elapsed time tracked by the duration tracker to trigger the sense amplifiers 112 at different elapsed times or durations.

Figure 2:
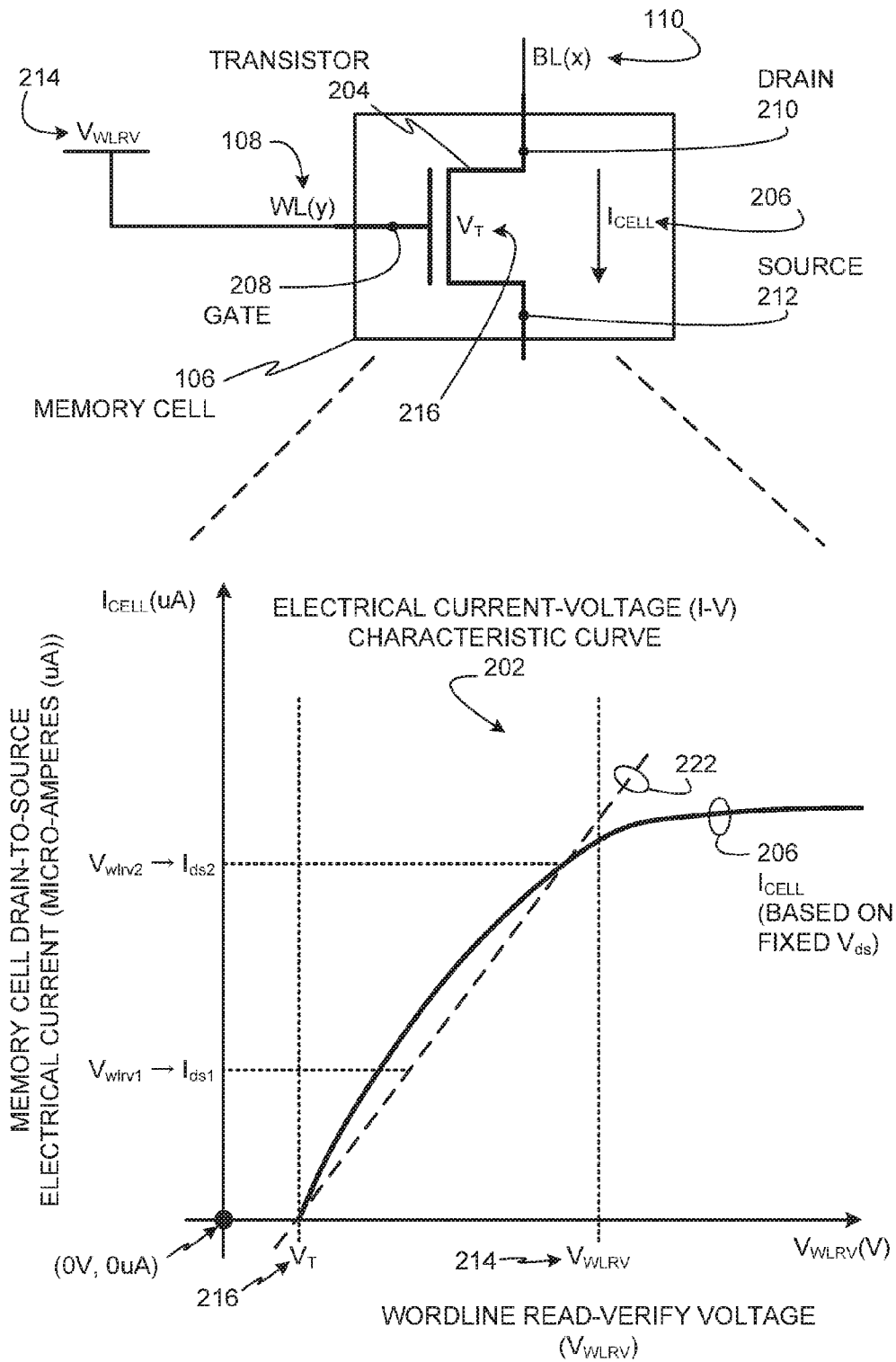
FIG. 2 is an example electrical current-voltage (I-V) characteristic curve of a memory cell transistor of the example flash memory of FIG. 1 showing the electrical current flow through the transistor relative to different wordline read-verify voltages ($V_{WLRV}$) applied at a gate terminal of the transistor.

FIG. 2 is an example electrical current-voltage (I-V) characteristic curve 202 of a memory cell transistor 204 of a memory cell 106 of the example flash memory 104 of FIG. 1. The I-V characteristic curve 202 shows an example memory cell electrical current ($I_{CELL}$) 206 through the transistor 204 relative to different wordline read-verify voltages ($V_{WLRV}$) 214 applied at a gate terminal 208 of the transistor 204. As shown in the illustrated example, the memory cell electrical current ($I_{CELL}$) 206 flows along the bitline (BL(x)) 110 between a drain terminal 210 and a source terminal 212 of the transistor 204. The I-V characteristic curve 202 of the illustrated example is based on a source voltage ($V_{SRC}$) applied to a source terminal 212 of the transistor 204 being equal to zero (e.g., $V_{SRC}=0V$). In the illustrated example, the I-V characteristic curve 202 shows that the memory cell current ($I_{CELL}$) 206 (e.g., a drain-to-source current ($I_{ds}$)) through the memory cell 106 is zero (e.g., $I_{ds}=I_{CELL}=0$ micro-amperes (uA)) when a wordline read-verify voltages ($V_{WLRV}$) 214 is less than or equal to a threshold voltage ($V_T$) 216 (e.g., $V_{WLRV}<=V_T$) of the transistor 204. The memory cell current ($I_{CELL}$) 206 through the memory cell 106 increases as the wordline read-verify voltage ($V_{WLRV}$) 214 applied to the gate terminal 208 of the transistor 204 increases farther away from the threshold voltage ($V_T$) 216 of the transistor 204.

The illustrated example of FIG. 2 also shows a linear range of a first order linear relationship 222 between the memory cell current ($I_{CELL}$) 206 and the wordline read-verify voltage ($V_{WLRV}$) 214. The first order linear relationship 222 shows that the amount of memory cell current ($I_{CELL}$) 206 through the memory cell 106 increases linearly with higher the wordline read-verify voltages ($V_{WLRV}$) 214 on the gate terminal 208 of the memory cell transistor 204. That is, the first order linear relationship 222 shows that a larger voltage separation (e.g., less voltage proximity) between the applied wordline read-verify voltage ($V_{WLRV}$) 214 and the programmed threshold voltage ($V_T$) 216 of the memory cell 106 results in a larger memory cell current ($I_{CELL}$) 206 through the memory cell 106. In addition, a smaller voltage separation (e.g., closer voltage proximity) between the applied wordline read-verify voltage ($V_{WLRV}$) 214 and the programmed threshold voltage ($V_T$) 216 of the memory cell 106 results in a smaller memory cell current ($I_{CELL}$) 206 through the memory cell 106. As such, by knowing the wordline read-verify voltage ($V_{WLRV}$) 214 applied to the gate terminal 208, examples disclosed herein determine the programmed threshold voltage within the linear range of the memory cell 106 by detecting the amount of the memory cell current ($I_{CELL}$) 206 based on one or more trigger count values (e.g., the trigger count values 138, 140, 142 of FIG. 1) and capacitor integration time of an integrating capacitor of a sense amplifier (e.g., the integrating capacitor ($C_{INT}$) 602 of the sense amplifier 112 of FIG. 6). That is, since the amount of the memory cell current ($I_{CELL}$) 206 affects the amount of time needed to develop a voltage on an integrating capacitor, sensing the voltage of the integrating capacitor at one or more times (e.g., based on the trigger count values 138, 140, 142) allows determining a programmed state of the memory cells 106. For example, if the voltage on the integrating capacitor develops quickly (e.g., due to a large memory cell current ($I_{CELL}$) 206), examples disclosed herein determine that the programmed state of the memory cell 106 is one in which there is a large voltage separation (e.g., less voltage proximity) between the applied wordline read-verify voltage ($V_{WLRV}$) 214 and the programmed threshold voltage ($V_T$) 216 of the memory cell 106. If the voltage on the integrating capacitor develops slowly (e.g., due to a large memory cell current ($I_{CELL}$) 206), examples disclosed herein determine that the programmed state of the memory cell 106 is one in which there is a small voltage separation (e.g., close voltage proximity) between the applied wordline read-verify voltage ($V_{WLRV}$) 214 and the programmed threshold voltage ($V_T$) 216 of the memory cell 106.

If the applied wordline read-verify voltage ($V_{WLRV}$) 214 is large enough, and the voltage on an integrating capacitor exceeds the boundary of linear range of the I-V characteristic curve 202, the I-V characteristic curve 202 of the memory cell 106 enters into the non-linear range of the I-V characteristic curve 202. In such instances, the trigger count values 138, 140, 142 (FIG. 1) can still be set based upon characterized values of memory cell electrical current ($I_{CELL}$) to threshold voltage ($V_T$) in the non-linear range. That is, programmed threshold voltages ($V_T$) of memory cells 106 can still be extracted or determined based on the pulse count techniques disclosed herein even when voltages on integrating capacitors are in the non-linear range of the I-V characteristic curve 202.

The memory cell electrical current ($I_{CELL}$) 206 of the memory cell 106 is a drain-to-source current ($I_{ds}$) that flows between the drain terminal 210 and the source terminal 212. The drain-to-source current ($I_{ds}$) is dependent on properties of the memory cell transistor 204 and voltages applied to the memory cell transistor 204 as shown in example Equations 1 and 2 below.

$$I_{ds} = \mu_n C_{ox} \frac{W}{L}(V_{gs} - V_T)V_{ds} \quad \text{Equation 1}$$

$$I_{ds} = \mu_n C_{ox} \frac{W}{L}(V_{wlrv} - V_{src} - V_T)(V_{bitline} - V_{src}) \quad \text{Equation 2}$$

In example Equation 1 above, an electron mobility ($\mu_n$) constant of the transistor 204 is multiplied by a gate capacitance per unit area ($C_{ox}$) constant of the transistor 204 to determine a product ($\mu_n C_{ox}$) that is multiplied by a quotient $$\left(\frac{W}{L}\right)$$

of a width (W) of the transistor 204 divided by a length (L) of the transistor 204 to determine a transistor properties expression $$\left(\mu_n C_{ox} \frac{W}{L}\right).$$

Also in example Equation 1, the difference between a gate-to-source voltage ($V_{gs}$) and the threshold voltage ($V_T$) of the transistor 204 is multiplied by a drain-to-source voltage ($V_{ds}$) of the transistor 204 to determine a transistor voltages expression (($V_{gs}-V_T)V_{ds}$). The drain-to-source current ($I_{ds}$) (and, thus, the memory cell electrical current ($I_{CELL}$) 206) is then expressed as the product of the transistor properties expression $$\left(\mu_n C_{ox} \frac{W}{L}\right)$$

and the transistor voltages expression (($V_{gs}-V_T)V_{ds}$).

In example Equation 2 above, the gate-to-source voltage ($V_{gs}$) is expressed as the difference between the wordline read-verify voltage ($V_{wlrv}$) 214 and a source voltage ($V_{src}$) of the transistor 204. Also in Equation 2 above, the drain-to-source voltage ($V_{ds}$) is expressed as the difference between the bitline read-verify voltage ($V_{bitline}$) and the source voltage ($V_{src}$) of the transistor 204. In examples disclosed herein, the source voltage ($V_{src}$) is the bias that is at source terminal 212, which is the sum of the applied bias voltage on a source plate of the flash memory 104 plus the supply rail IR (current-resistance) drop of the conducting material that is connected between the source terminal 212 of the memory cell 106 and the source plate of the flash memory 104. That is, the source plate of the flash memory 104 develops a SRC bounce voltage bias based on rapid discharges of electrical current from the gate-to-source voltages ($V_{gs}$) to the source plate of the flash memory 104 when wordline read-verify voltages ($V_{WLRV}$) applied to gate terminals of the memory cells 106 are much higher than the threshold voltages ($V_T$) of the memory cells 106.

Although the illustrated example of FIG. 2 shows the first order linear relationship 222, examples disclosed herein may additionally or alternatively be implemented based on second and/or third order linear relationships between the memory cell current ($I_{CELL}$) 206 and the wordline read-verify voltage ($V_{WLRV}$) 214. In such examples, the second and/or third order relationships can be used to increase the accuracy with which the programmed threshold voltage ($V_T$) 216 of the memory cell 106 can be determined.

Figure 3:
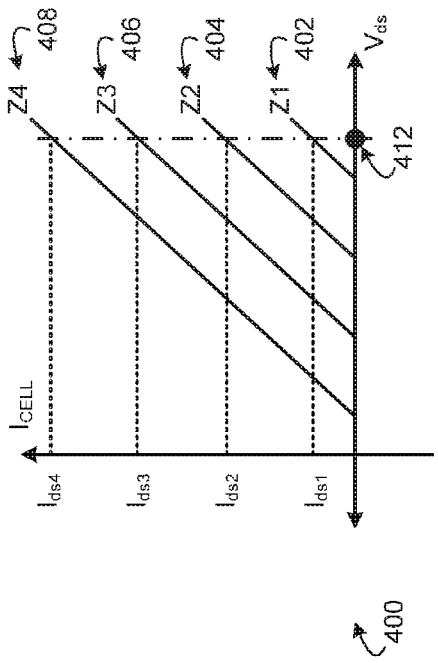
FIG. 3 is a memory cell programmed states graph showing example memory cell threshold voltage ($V_T$) programmed states distribution of memory cells of the flash memory of FIG. 1.
Figure 4:
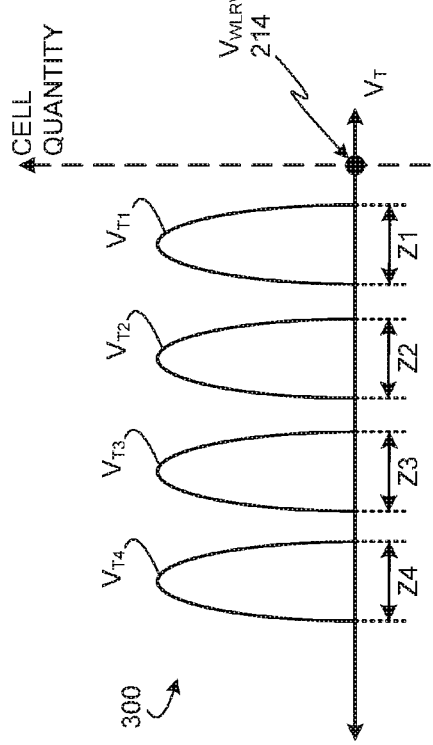
FIG. 4 is a graph showing example first order linear approximations between memory cell electrical current ($I_{CELL}$) and mean threshold voltage distributions of memory cells represented in the memory cell programmed states graph of FIG. 3.
Figure 5:
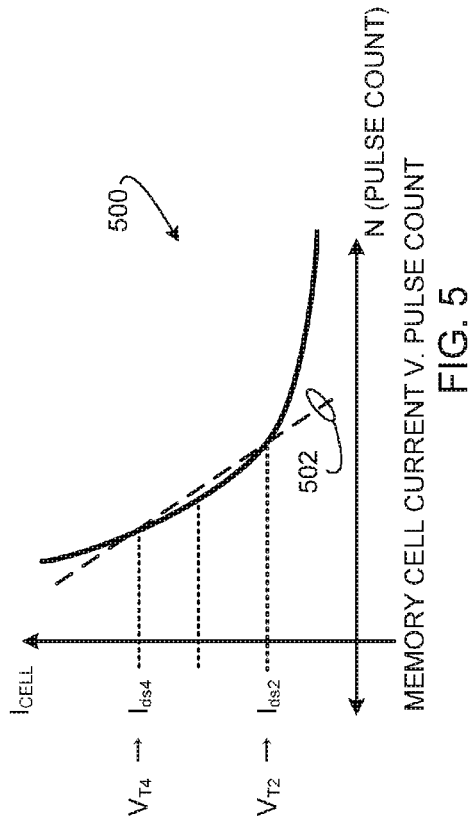
FIG. 5 is an example electrical current-pulse count (I-N) characteristic curve of a memory cell transistor of the example flash memory of FIG. 1 showing an example first order linear relationship between memory cell electrical current flow ($I_{CELL}$) and different clock pulse counts indicative of elapsed time required for tripping a memory cell sense amplifier.

FIGS. 3-5 depict graphs showing relationships between threshold voltages ($V_T$) (e.g., the threshold voltage ($V_T$) 216 of FIG. 2), memory cell current ($I_{CELL}$) (e.g., the memory cell current ($I_{CELL}$) 206 of FIG. 2), and pulse counts (e.g., the trigger count values 138, 140, 142 of FIG. 1). FIG. 3 is a memory cell programmed states graph 300 showing example memory cell threshold voltage programmed states of memory cells 106 of the flash memory 104 of FIG. 1. FIG. 4 is a graph 400 showing example first order linear approximations between memory cell current ($I_{CELL}$) and mean threshold voltage distributions of memory cells represented in the memory cell programmed states graph of FIG. 3. FIG. 5 is an example electrical current-pulse count (I-N) characteristic curve of a memory cell transistor of the example flash memory of FIG. 1 showing an example first order linear relationship between the memory cell electrical current flow ($I_{CELL}$) and different clock pulse counts indicative of elapsed time to trip a sense amplifier 112.

Turning to FIG. 3, the example memory cell programmed states graph 300 shows relationships of mean threshold voltage distributions $V_{T1}$, $V_{T2}$, $V_{T3}$, $V_{T4}$ of the memory cells 106 relative to a wordline read-verify voltage ($V_{WLRV}$) 214. In the illustrated example, the wordline read-verify voltage ($V_{WLRV}$) 214 is the desired wordline read-verify voltage ($V_{WLRV}$) for the memory cells 106 that are in operation (e.g., memory cells 106 that are activated or precharged for sensing), and the threshold voltage distributions $V_{T1}$, $V_{T2}$, $V_{T3}$, $V_{T4}$ are actual programmed states of different ones of the memory cells 106. Examples disclosed herein can be used to determine distributions of the memory cells 106 into the programmed state zones Z1, Z2, Z3, Z4 to identify the voltage proximities between the programmed threshold voltages ($V_T$) (e.g., the threshold voltage ($V_T$) 216 of FIG. 2) of the memory cells 106 and the wordline read-verify voltage ($V_{WLRV}$) 214.

The example threshold voltage distributions $V_{T1}$, $V_{T2}$, $V_{T3}$, $V_{T4}$ are observed based on a fixed wordline read-verify voltage ($V_{WLRV}$) 214 at gate terminals of the memory cells 106 (e.g., the wordline read-verify voltage ($V_{WLRV}$) 214 shown at the gate terminal 208 of the memory cell 106 of FIG. 2), based on a fixed source terminal voltage ($V_{src}$) at source terminals of the memory cells 106 (e.g., the source terminal 212 of the memory cell 106 of FIG. 2), and based on a fixed drain terminal voltage ($V_{src}$) at bitlines of the memory cells 106 (e.g., the bitline terminal 110 of the memory cell 106 of FIG. 2). In the illustrated example, the wordline read-verify voltage ($V_{WLRV}$) 214 is selected to be slightly more (e.g., 100~500 mV more) than the target threshold voltage distribution to be extracted. In this manner, ones of the memory cells 106 having greater voltage separations between their programmed threshold voltages ($V_T$) and the wordline read-verify voltage ($V_{WLRV}$) 214 will be closer to or in the fourth programmed state zone Z4, and ones of the memory cells 106 having a closer voltage proximity between their programmed threshold voltages ($V_T$) and the wordline read-verify voltage ($V_{WLRV}$) 214 will be closer to or in the first programmed state zone Z1. The voltage separations or voltage proximities between the wordline read-verify voltage ($V_{WLRV}$) 214 and programmed threshold voltages ($V_T$) of the memory cells are shown using example Equations 3 and 4 below.

$$\text{voltage proximity} = (V_{gs} - V_T) \qquad \text{Equation 3}$$

$$\text{voltage proximity} = (V_{WLRV} - V_{src} - V_T),$$

$$\text{where } V_{gs} = (V_{WLRV} - V_{src}) \qquad \text{Equation 4}$$

In example Equation 3 above, the voltage proximity is the voltage proximity (or voltage separation) between the wordline read-verify voltage ($V_{WLRV}$) 214 and the programmed threshold voltage ($V_T$) 216 of a memory cell 106. The voltage proximity of Equation 3 is determined as the difference between a gate-to-source voltage ($V_{gs}$) of a memory cell transistor (e.g., the memory cell transistor 204 of FIG. 2) and the programmed threshold voltage ($V_T$) 216 of the memory cell 106. In example Equation 4 above, the voltage proximity is shown in terms of the wordline read-verify voltage ($V_{WLRV}$) 214 and the source terminal voltage ($V_{src}$) in which the voltage proximity is determined as the programmed threshold voltage ($V_T$) 216 of the memory cell 106, the source terminal voltage ($V_{src}$) of the memory cell 106, and the wordline read-verify voltage ($V_{WLRV}$) 214 of the memory cell 106.

In the illustrated example of FIG. 4, the graph 400 shows example first order linear approximations between memory cell current ($I_{CELL}$) through the memory cells 106 and the mean distributions of the threshold voltages $V_{T1}$, $V_{T2}$, $V_{T3}$, $V_{T4}$ of FIG. 3. The mean threshold voltage distributions $V_{T1}$, $V_{T2}$, $V_{T3}$, $V_{T4}$ are shown in FIG. 4 as a first zone Z1 first order linear approximation 402, a second zone Z2 first order linear approximation 404, a third zone Z3 first order linear approximation 406, and a fourth zone Z4 first order linear approximation 408. In the illustrated example, a fixed drain-to-source voltage ($V_{ds}$) 412 is shown. The fixed drain-to-source voltage ($V_{ds}$) 412 refers to the voltage across drain terminals and source terminals of the memory cells (e.g., the drain terminal 210 and the source terminal 212 of the memory cell 106 of FIG. 2). The fixed drain-to-source voltage ($V_{ds}$) 412 is represented according to example Equation 5 below.

$$V_{ds} = V_{bl} - V_{src} \qquad \text{Equation 5}$$

In example Equation 5 above, the drain-to-source voltage ($V_{ds}$) 412 is represented as the difference between a bitline voltage ($V_{bl}$) and a source voltage ($V_{src}$). The bitline voltage ($V_{bl}$) is the voltage (e.g., ~0.4V) applied to a corresponding bitline (BL(x)) 110 (FIG. 1) of a memory cell 106 when the memory cell 106 is activated or precharged to enable reading the memory cell 106.

The example graph 400 of FIG. 4 shows that the first zone Z1 first order linear approximation 402, the second zone Z2 first order linear approximation 404, the third zone Z3 first order linear approximation 406, and the fourth zone Z4 first order linear approximation 408 reach the drain-to-source voltage ($V_{ds}$) 412 at corresponding memory cell electrical currents ($I_{CELL}$) shown as a first drain-to-source current ($I_{ds1}$), a second drain-to-source current ($I_{ds2}$), a third drain-to-source current ($I_{ds3}$), and a fourth drain-to-source current ($I_{ds4}$). As such, the example graph 300 of FIG. 3 and the example graph 400 of FIG. 4 show how memory cell electrical current ($I_{CELL}$) is an indicator of the threshold voltage ($V_T$) of a memory cell. More specifically, the memory cell electrical current ($I_{CELL}$) is inversely proportional to the threshold voltage ($V_T$) of a memory cell. For example, for the fourth programmed state zone Z4 shown furthest from the wordline read-verify voltage ($V_{WLRV}$) 214 in FIG. 3, the fourth zone Z4 first order linear approximation 408 of FIG. 4 corresponds to the highest drain-to-source current ($I_{ds4}$) for ones of the memory cells 106 having threshold voltages ($V_T$) equal to the fixed drain-to-source voltage ($V_{ds}$) 412.

The memory cell electrical current ($I_{CELL}$) can represented as the drain-to-source electrical current ($I_{ds}$) of example Equation 6 below.

$$I_{ds} \propto C + K V_T \qquad \text{Equation 6}$$

According to example Equation 6 above, a drain-to-source electrical current ($I_{ds}$) represents a memory cell electrical current ($I_{CELL}$) that is proportional to ($\propto$) the sum of a drain-to-source electrical current constant (C) and the product of a threshold voltage ($V_T$) and a rate-of-change constant value (K). In example Equation 4 above, the drain-to-source electrical current ($I_{ds}$) of a memory cell 106 is equal to the drain-to-source electrical current constant (C) when the threshold voltage ($V_T$) of the memory cell 106 is zero. Also in example Equation 6 above, the rate-of-change constant value (K) represents the rate of change of the drain-to-source electrical current ($I_{ds}$) relative to different memory cell threshold voltages ($V_T$) fixed at the drain-to-source voltage ($V_{ds}$) 412.

FIG. 5 is an example electrical current-pulse count (I-P) characteristic curve 500 of a memory cell transistor (e.g., the transistor 204 of FIG. 2) of the example flash memory 104 of FIG. 1. The example I-P characteristic curve 500 shows an example first order linear relationship 502 between the memory cell electrical current flow ($I_{CELL}$) and time, represented by incremented/accumulated pulse counts. For example, the I-P characteristic curve 500 shows that a fourth drain-to-source current ($I_{ds4}$) of a memory cell 106 can be sensed in less time (e.g., less pulse counts) than a second drain-to-source current ($I_{ds2}$). In addition, the amount of electrical current between the fourth drain-to-source current ($I_{ds4}$) and the second drain-to-source current ($I_{ds2}$) decreases linearly relative to an increase in pulse counts (e.g., an increase in elapsed time).

The example of FIG. 5 also shows how the I-P characteristic curve 500 can be used to determine threshold voltages ($V_T$) of memory cells. For example, as shown in FIG. 5, when the fourth drain-to-source current ($I_{ds4}$) flows through a memory cell 106, the memory cell 106 is programmed to a fourth threshold voltage ($V_{T4}$). In addition, when the second drain-to-source current ($I_{ds2}$) flows through a memory cell 106, the memory cell 106 is programmed to a second threshold voltage ($V_{T2}$). As such, the I-P characteristic curve 500 shows that the fourth threshold voltage ($V_{T4}$) can be sensed using a smaller pulse count than a pulse count used to sense the second threshold voltage ($V_{T2}$).

Figure 6:
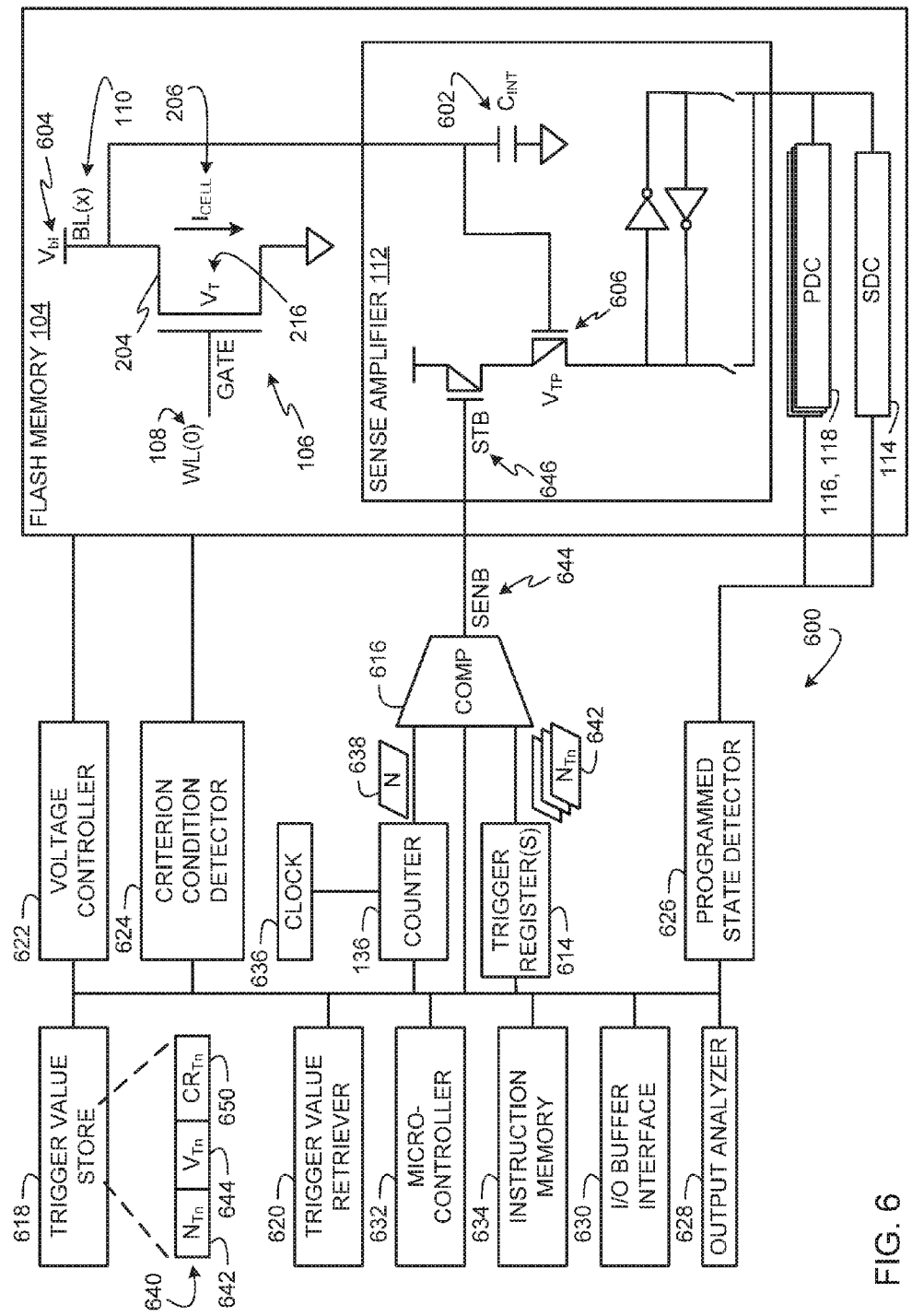
FIG. 6 a block diagram of the example flash memory of FIG. 1 and an example apparatus that may be implemented in the example memory controller of FIG. 1 in accordance with the teachings of this disclosure.

FIG. 6 a block diagram of the example flash memory 104 of FIG. 1 and an example apparatus 600 implemented in accordance with the teachings of this disclosure. The apparatus 600 of the illustrated example is configured to read programmed states of the memory cells 106 (FIGS. 1 and 2) in semiconductor memory devices (e.g., the flash memory 104) based on clock pulse counts (e.g., the trigger count values 138, 140, 142 of FIG. 1) as disclosed herein. The example apparatus 600 may be implemented in the example memory controller 102 of FIG. 1 or separate from the memory controller 102. In some examples, some portions of the apparatus 600 may be implemented in the memory controller 102 and other portions of the apparatus 600 may be implemented separate from the memory controller 102.

The illustrated example of FIG. 6 shows the transistor 204 of the memory cell 106 in the flash memory 104. The illustrated example of FIG. 6 also shows how the memory cell 106 is in circuit with a corresponding one of the sense amplifiers 112. In the illustrated example, the sense amplifier 112 includes an integrating capacitor ($C_{INT}$) 602 connected in parallel with the memory cell transistor 204 of the flash memory 104. In the illustrated example, when the memory cell 106 is activated with the wordline read-verify voltage ($V_{WLRV}$) 214 (FIG. 2) on the wordline (WL(0)) 108 and with a bitline precharge voltage ($V_{bl}$) 604 (e.g., ~0.4V) on the corresponding bitline (BL(x)) 110, the memory cell electrical current ($I_{CELL}$) 206 starts to flow through the memory cells 106 and to develop a voltage on the integrating capacitor ($C_{INT}$) 602. Since the integrating capacitor ($C_{INT}$) 602 is in parallel with the memory cell transistor 204, the integrating capacitor ($C_{INT}$) 602 will develop a voltage over time relative to the programmed threshold voltage ($V_T$) 216 of the transistor 204. If the voltage separation between the wordline read-verify voltage ($V_{WLRV}$) 214 and the programmed threshold voltage ($V_T$) 216 is large, the memory cell electrical current ($I_{CELL}$) 206 is proportionally high (e.g., see Equations 1 and 2 above). If the voltage separation between the wordline read-verify voltage ($V_{WLRV}$) 214 and the programmed threshold voltage ($V_T$) 216 is small, the memory cell electrical current ($I_{CELL}$) 206 is proportionally low (e.g., see Equations 1 and 2 above). In the illustrated example, a high memory cell electrical current ($I_{CELL}$) 206 will cause the integrating capacitor ($C_{INT}$) 602 to develop a sensing voltage to trip the sense amplifier 112 relatively faster than if the memory cell electrical current ($I_{CELL}$) 206 were lower. Although one integrating capacitor ($C_{INT}$) 602 is shown in FIG. 6, the sense amplifiers 112 of FIG. 1 include a plurality of integrating capacitors such that each bitline (BL) 110 is in circuit with a corresponding integrating capacitor in the sense amplifiers 112.

By controlling the sense amplifier 112 to sense the voltage across the integrating capacitor ($C_{INT}$) 602 at different times based on different pulse counts (e.g., the trigger count values 138, 140, 142 of FIG. 1), the apparatus 600 can determine the programmed threshold voltage ($V_T$) 216 of the memory cell 106. Example Equation 7 below shows the relationship between sense time and capacitor integration ($C_{int}$) ($t_{sen}$) relative to a threshold voltage ($V_{TP}$) of a PMOS transistor 606 in the sense amplifier 112 and the memory cell electrical current ($I_{CELL}$) 206.

$$t_{sen} = (C_{int} \times V_{TP})/I_{CELL} \qquad \text{Equation 7}$$

In example Equation 7 above, the sense time ($t_{sen}$) is a duration needed by the integrating capacitor ($C_{INT}$) 602 to develop sufficient voltage to trip the PMOS transistor 606 in the sense amplifier 112. In the illustrated examples of Equation 7 and FIG. 6, the threshold voltage ($V_{TP}$) of the PMOS transistor 606 is the trip voltage of the sense amplifier 112. According to example Equation 7, the sense time needed to ($t_{sen}$) sense the programmed threshold voltage ($V_T$) 216 is expressed as the product of a capacitor integration ($C_{int}$) constant of the integrating capacitor ($C_{INT}$) 602 and the threshold voltage ($V_{TP}$) of the PMOS transistor 606 in the sense amplifier 112 divided by the memory cell electrical current ($I_{CELL}$) 206. Using example Equation 7, different sense times for different ones of the drain-to-source electrical currents ($I_{ds1}$–$I_{ds4}$) of FIGS. 4 and 5 can be expressed as shown in example Equations 8 and 9 below.

$$t_1 = (C_{int} \times V_{TP})/I_{ds1} \qquad \text{Equation 8}$$

$$t_n = (C_{int} \times V_{TP})/I_{dsn} \qquad \text{Equation 9}$$

Example Equation 8 above shows a first sense time ($t_1$) for controlling the sense amplifier 112 to sense first programmed threshold voltages ($V_{T1}$) (FIG. 3) corresponding to a first drain-to-source electrical current ($I_{ds2}$). Example Equation 9 above shows an $n^{th}$ sense time ($t_n$) for controlling the sense amplifier 112 to sense an $n^{th}$ programmed threshold voltages ($V_{Tn}$) corresponding to an $n^{th}$ drain-to-source electrical current ($I_{dsn}$).

Examples disclosed herein track sense time ($t_{sen}$) using clock signal pulse counts (N) such as the trigger count values 138, 140, 142 of FIG. 1. Example Equation 10 below expresses the relationship between sense time ($t_{sen}$) and pulse count (N) of a clock period ($T_{clk}$) of an input clock signal.

$$t_{sen} = N \times T_{clk} \qquad \text{Equation 10}$$

Example Equation 11 below is an algebraic rearrangement of example Equation 10 above and expresses the relationship between pulse counts (N) and example Equations 6 and 7 above. As shown in example Equation 10 above, the sense time ($t_{sen}$) is directly proportional to the pulse count (N) and to the clock period ($T_{clk}$). As such, increasing the pulse count (N) increases the sense time In addition, ($t_{sen}$). In addition, increasing the clock period ($T_{clk}$) also increases the sense time ($t_{sen}$). As such, the sense time ($t_{sen}$) can be changed by selecting different pulse counts (N) and/or selecting different clock periods ($T_{clk}$). For example, for a fixed sensing time, the clock period ($T_{clk}$) can be decreased to achieve higher resolution readings of memory cell programmed states (e.g., finer granularity to differentiate between threshold voltages ($V_T$) that are closer to one another in voltage proximity).

$$N = t_{sen}/T_{clk} = ((C_{int} \times V_{TP})/T_{clk})(1/(C+KV_T)) \qquad \text{Equation 11}$$

As shown in example Equation 11 above, a pulse count (N) for controlling a time at which the sense amplifier 112 senses the programmed threshold voltages ($V_T$) 216 based on a sensing voltage developed on the integrating capacitor 602 is expressed as the product of the capacitor integration ($C_{int}$) constant of the integrating capacitor ($C_{INT}$) 602 and the threshold voltage ($V_{TP}$) of the PMOS transistor 606 in the sense amplifier 112 divided by the clock period ($T_{clk}$) of an input clock signal, ((($C_{int} \times V_T$)/$T_{clk}$)), multiplied by the inverse of the expression shown in Equation 6 above.

The example apparatus 600 of FIG. 6 uses pulse counts (N) to control the sense amplifier 112 to sense the threshold voltage ($V_T$) 216 programmed state of the memory cell 106. In the illustrated example, the apparatus is provided with the example counter 136 (FIG. 1) (e.g., a duration tracker), one or more example trigger register(s) 614, an example comparator 616, an example trigger value store 618, an example trigger value retriever 620, an example voltage controller 622, an example criterion condition detector 624, an example programmed state detector 626, an example output analyzer 628, an example I/O buffer interface 630, an example micro-controller 632, and an example instruction memory 634. Also shown in the illustrated example is an example clock 636 that drives the counter 136. For example, the clock 636 may be a high-frequency clock (e.g., 500 megahertz (MHz)-1 gigahertz (GHz)) or a clock of any other suitable speed. In some examples, the clock 636 is provided in the apparatus 600. In other examples, the clock 636 is separate from the apparatus 600 and provides a clock signal to the apparatus 600 for driving the counter 136. In some examples, the clock 636 is implemented using a clock of the memory controller 102 that is used in the memory controller 102 for other purposes such as controlling the timing of read and/or write operations.

In the example apparatus 600, the counter 136 receives an input clock signal from the clock 636 having a clock period ($T_{clk}$) and generates pulse counts (N) 638 over time based on the clock period ($T_{clk}$) of the clock 636. The example trigger register(s) 614 store(s) trigger count values ($N_T$) 642, such as the trigger count values 138, 140, 142 of FIG. 1, to indicate when the sense amplifier 112 is to latch a value corresponding to a sensed voltage across the integrating capacitor ($C_{INT}$) 602. For example, the trigger value store 618 may include a data structure 640 (e.g., a look-up table, a mapping table, an association table, etc.) to store numerous trigger count values ($N_{Tn}$) 642 (e.g., the trigger count values 138, 140, 142 of FIG. 1) in association with corresponding different threshold voltages ($V_{Tn}$) 644 of memory cells 106. The numerous trigger count values ($N_{Tn}$) 642 of the illustrated example correspond to different sense times for sensing corresponding ones of the threshold voltages ($V_{Tn}$) 644. When the apparatus 600 is to sense a particular threshold voltage ($V_{Tn}$) 644, the example trigger value retriever 620 can obtain a corresponding trigger count value ($N_{Tn}$) 642 from the trigger value store 618, and load or store the obtained trigger count value ($N_{Tn}$) 642 in a trigger register 614. The example comparator 616 can then compare the trigger count value ($N_{Tn}$) 642 to pulse counts (N) 638 generated by the counter 136 to toggle a SENB signal 646 when the pulse count (N) 638 matches the trigger count value ($N_{Tn}$) 642 loaded in the trigger register 614. In the illustrated example, the SENB signal 646 asserts a strobe (STB) line 646 of the sense amplifier 112 which triggers the sense amplifier 112 to latch a binary value corresponding to the sensed voltage across the integrating capacitor ($C_{INT}$) 602. In the illustrated example, the apparatus 600 can use the binary value to determine the programmed threshold voltage ($V_T$) 216 of the memory cell 106.

In some examples in which numerous trigger count registers 614 are provided, the example trigger value retriever 620 can obtain numerous trigger count values ($N_{Tn}$) 642 from the trigger value store 618 and load the numerous trigger count values ($N_{Tn}$) 642 in different ones of the trigger count registers 614 for use by the comparator 616. In yet other examples, numerous trigger count registers 614 may be provided with static trigger count values ($N_{Tn}$) 642 that do not change. In such examples, the comparator 616 toggles its SENB signal 644 based on the same static trigger count values ($N_{Tn}$) 642 whenever reads of the flash memory 104 are performed.

The example voltage controller 622 is provided to control voltage levels applied to the memory flash 104. For example, the voltage controller 622 controls activating the wordline (WL(0)) 108 with, for example, the wordline read-verify voltage ($V_{WLRV}$) 214 (FIG. 2), and controls the precharging of the bitlines (BL(x)) 110 with, for example, the bitline precharge voltage $V_{bl}$ 604.

The example criterion condition detector 624 is provided for example implementations in which the trigger count values ($N_{Tn}$) 642 are selected from the trigger value store 618 based on criteria corresponding to different characteristics of the flash memory 104. Example criteria may be temperature of a memory cell array of the flash memory 104, locations of memory cells 106 within a memory cell array of the flash memory 104, and/or values of threshold voltages ($V_T$) intended to be read from the memory cells 106. Examples of using such criteria are described in connection with FIGS. 7A, 7B, 8, and 9 below. To use characteristics of the flash memory 104 as criteria for selecting the trigger count values ($N_{Tn}$) 642, the data structure 640 of the trigger value store 618 stores characteristic values $CR_{Tn}$ 650 (e.g., temperature coefficient values, location values, target threshold voltage ($V_{TT}$) values, etc.) in association with different corresponding trigger count values ($N_{Tn}$) 642 so that different trigger count values ($N_{Tn}$) 642 can be used to dynamically update the trigger register(s) 614 based on the characteristics of the flash memory 104. In this manner, when the example criterion condition detector 624 measures a criterion condition of the flash memory 104, the trigger value retriever 620 can use the measured criterion condition as feedback to dynamically retrieve one or more corresponding trigger count value(s) ($N_{Tn}$) 642 from the trigger value store 618 based on the criterion characteristic measured by the example criterion condition detector 624 and load the retrieved trigger count value(s) ($N_{Tn}$) 642 in the trigger register(s) 614 for use by the comparator 616.

The example programmed state detector 626 is in circuit with the SDC 114 and the PDCs 116, 118. The example programmed state detector 626 determines the programmed threshold voltage ($V_T$) 216 of the memory cell 106 based on the binary value(s) latched by the sense amplifier 112 into one or more of the SDC 114, the PDC1 116, and/or the PDC2 118. For example, the programmed state detector 626 can receive a threshold voltage ($V_{Tn}$) 644 value from the trigger value retriever 620 corresponding to the trigger count value ($N_{Tn}$) 642 loaded in the trigger register 614. The example programmed state detector 626 can then determine that for each binary one '1' stored in a data cache (e.g., the SDC 114, the PDC1 116, the PDC2 118), the programmed state of a corresponding memory cell 106 is the threshold voltage ($V_{Tn}$) 644 value corresponding to the trigger count value ($N_{Tn}$) 642 used by the comparator 616 to assert the STB line 646 of the sense amplifier 112.

The example output analyzer 628 is provided to analyze the programmed states determined by the programmed state detector 626. For example, when examples disclosed herein are used during program-verify processes, the output analyzer 628 can analyze the programmed states from the programmed state detector 626 to determine whether memory cells 106 are programmed to a target threshold voltage ($V_{TT}$). In some examples, the output analyzer 628 determines soft bit information from memory cells 106. For example, the output analyzer 628 may analyze programmed states from the programmed state detector 626 to analyze the threshold voltage ($V_T$) distributions of the memory cells 106 to determine whether to shift threshold voltage ($V_T$) range boundaries (e.g., reference voltages) to represent stored data. For example, over time the flash memory 104 may degrade or otherwise undergo changes to its electrical properties. Under such circumstances, ranges of threshold voltages ($V_T$) that represent stored information may shift such that a threshold voltage ($V_T$) distribution of the flash memory 104 loses its accuracy in representing the stored information. To avoid losing such stored information, reference voltages defining the range boundaries of the threshold voltages ($V_T$) may be changed to align the threshold voltage ($V_T$) distribution of the flash memory 104 to accurately correspond to the stored information. Examples for extracting soft bit information from the flash memory using techniques disclosed herein are described below in connection with FIGS. 11A and 11B.

The example I/O buffer interface 630 is provided to output data stored in the flash memory 104 to a memory data bus. For example, when a host processor (e.g., the processor 1412 of FIG. 14) requests data to be read from the flash memory 104, the apparatus 600 may read data from the flash memory 104 using examples disclosed herein and the I/O buffer interface 630 may load the read data to a memory data bus that is accessible by the host processor.

The example micro-controller 632 is provided to execute machine readable instructions to implement one or more components of the example apparatus 600. The example instruction memory 634 is provided to store machine readable instructions executable by the micro-controller 632 to implement one or more components of the apparatus 600. In some examples, the micro-controller 632 and the instruction memory 634 are omitted, and the components of the apparatus 600 are implemented in logic circuits and/or other suitable hardware. In some examples, some components of the apparatus 600 are implemented using machine readable instructions stored in the instruction memory 634 and executed by the micro-controller 632 and others of the components of the apparatus 600 are implemented in hardware.

While an example manner of implementing the example apparatus 600 is illustrated in FIG. 6, one or more of the elements, processes and/or devices illustrated in FIG. 6 may be combined, divided, re-arranged, omitted, eliminated and/or implemented in any other way. Further, the example counter 136, the example trigger register 614, the example comparator 616, the example trigger value store 618, the example trigger value retriever 620, the example voltage controller 622, the example criterion condition detector 624, the example programmed state detector 626, the example output analyzer 628, the example I/O buffer interface 630, and/or, more generally, the example apparatus 600 of FIG. 6 may be implemented by hardware, software, firmware and/or any combination of hardware, software and/or firmware. Thus, for example, any of the example counter 136, the example trigger register 614, the example comparator 616, the example trigger value store 618, the example trigger value retriever 620, the example voltage controller 622, the example criterion condition detector 624, the example programmed state detector 626, the example output analyzer 628, the example I/O buffer interface 630, and/or, more generally, the example apparatus 600 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example counter 136, the example trigger register 614, the example comparator 616, the example trigger value store 618, the example trigger value retriever 620, the example voltage controller 622, the example criterion condition detector 624, the example programmed state detector 626, the example output analyzer 628, and/or the example I/O buffer interface 630 is/are hereby expressly defined to include a tangible computer readable storage device or storage disk such as a memory, a digital versatile disk (DVD), a compact disk (CD), a Blu-ray disk, etc. storing the software and/or firmware. Further still, the example apparatus 600 of FIG. 6 may include one or more elements, processes and/or devices in addition to, or instead of, those illustrated in FIG. 6, and/or may include more than one of any or all of the illustrated elements, processes and devices.

FIG. 7A is a programmed states graph 700 showing observed programmed states 702 of target memory cells (e.g., ones of the memory cells 106 of FIG. 1). In the illustrated example, the programmed states 702 are a distribution of programmed threshold voltages ($V_T$) of ones of the memory cells 106 that are targeted for programming to a target threshold voltage ($V_{TT}$) 706. In the illustrated example, the observed programmed states 702 are sensed during a program-verify process of a programming phase during which data is written to the flash memory 104. For example, during the programming phase, the memory controller 102 (FIG. 1) writes data to target memory cells by performing one or more programming passes on the target memory cells in which electrical programming pulses are used to change the electron charges on gate terminals (e.g., the gate terminal 208 of FIG. 2) of the target memory cells. In this manner, the electron charge characteristics of the gate terminals result in the target memory cells having programmed threshold voltage ($V_T$) equal to a target threshold voltage ($V_{TT}$) 706 representative of binary data intended for storage in those target memory cells. In some instances in which the electron charges on the gate terminals need to be changed significantly, multiple programming passes must be performed without over-programming the target memory cells so that programmed threshold voltages ($V_T$) of the memory cells do not exceed the target threshold voltage ($V_{TT}$) 706.

After each programming pass, the memory controller 102 performs a program-verify process to determine programmed threshold voltages ($V_T$) of the target memory cells. In this manner, the memory controller 102 can determine when the target memory cells have reached the intended target threshold voltage ($V_{TT}$) 706 corresponding to the data intended to be written. In addition, the memory controller 102 can determine voltage separations between programmed threshold voltages ($V_T$) of the target memory cells and the intended target threshold voltage ($V_{TT}$) 706. By determining the voltage separations of target memory cells and when target memory cells have reached the intended target threshold voltage ($V_{TT}$) 706, the memory controller 102 can determine which target memory cells no longer require electrical programming pulses to further change the electron charges on their corresponding gate terminals, which target memory cells are relatively close to the intended target threshold voltage ($V_{TT}$) 706 such that they require only a partial programming pulse (e.g., a SSPC (Selective Slow Program Convergence) programming pulse) (e.g., by biasing a bitlines of corresponding memory cells to 1V instead of 0V to slow down the programming rate of those corresponding memory cells) to reach the intended target threshold voltage ($V_{TT}$) 706, and which target memory cells are still relatively far from the intended target threshold voltage ($V_{TT}$) 706 such that they require full programming pulses (PGM) (e.g., by biasing bitlines of corresponding memory cells to 0V to enable programming those corresponding memory cells at a full programming rate) to reach the intended target threshold voltage ($V_{TT}$) 706.

The illustrated example of FIG. 7A shows an example target threshold voltage ($V_{TT}$) 706 (e.g., a program-verify voltage ($V_{PV}$)) relative to three programmed state zones Z1, Z2, Z3 across the threshold voltage ($V_T$) distribution of the programmed states 702 of target memory cells. In the illustrated example, target memory cells in the third programmed state zone Z3 have the largest voltage separation between their programmed threshold voltages ($V_T$) and the target threshold voltage ($V_{TT}$) 706, which in turn, results in the largest memory cell electrical current ($I_{CELL}$) through those target memory cells. The second programmed state zone Z2 includes target memory cells having programmed threshold voltages ($V_T$) with relatively closer voltage proximities to the target threshold voltage ($V_{TT}$) 706, which in turn, results in smaller memory cell electrical current ($I_{CELL}$) through those target memory cells. The first programmed state zone Z1 includes target memory cells having programmed threshold voltages ($V_T$) that satisfy the target threshold voltage ($V_{TT}$) and, thus, have the smallest memory cell electrical current ($I_{CELL}$) or no cell current. The example programmed state zones Z1, Z2, Z3 of the illustrated example may be used to determine which target memory cells still require one or more programming passes and the type of electrical programming pulse (e.g., a partial SSPC programming pulse, or a full PGM programming pulse) to apply. For example, in the illustrated example of FIG. 7, target memory cells in the third programmed state zone Z3 require at least another programming pass using a full PGM programming pulse, target memory cells in the second programmed state zone Z2 require at least another programming pass using a partial SSPC programming pulse, and target memory cells in the first programmed state zone Z1 do not require any further programming pulse.

FIG. 7B depicts trigger count values $N_{T1}$ 714 and $N_{T2}$ 716 to acquire the programmed states 702 of target memory cells shown in the programmed states graph 700 of FIG. 7A. FIG. 7B also shows an example clock signal 720 provided by, for example, the clock 636 of FIG. 6. The example clock signal 720 drives the example counter 136 to generate the pulse counts (N) 638 of FIG. 6. FIG. 7B also shows an example trigger (SENB) signal 722 (e.g., the SENB signal 644 of FIG. 6) that may be provided by the example comparator 616 of FIG. 6 to assert the strobe (STB) line 646 of the sense amplifier 112 of FIG. 6. In the illustrated example, the sense amplifier 112 is a NAND memory sense amplifier, and the strobe (STB) line 646 of the sense amplifier 112 is a level-triggered line. In the illustrated example, a low level on the example trigger (SENB) signal 722 asserts the strobe (STB) line 646 to cause the sense amplifier 112 to latch values.

In the illustrated example, the pulse count (N) 638 starts at zero (N=0) and the first trigger count value $N_{T1}$ 714 is loaded into the trigger register 614. When the voltage controller 622 (FIG. 6) activates the target memory cells for reading/sensing their programmed threshold voltages ($V_T$), the counter 136 starts incrementing/accumulating the pulse count (N) 638. When the target memory cells are activated by the voltage controller 622 by applying the wordline read-verify voltage ($V_{WLRV}$) 214 (FIG. 2) to a corresponding wordline (WL) and by precharging corresponding bitlines (BL) with the bitline precharge voltage ($V_{bl}$) 604 (FIG. 6), memory cell electrical currents ($I_{CELL}$) begin to flow through the target memory cells, which causes sensing voltages to develop at corresponding integrating capacitors (e.g., the integrating capacitor ($C_{INT}$) 602 of FIG. 6). As integrating capacitor sensing voltages develop over time, the comparator 616 (FIG. 6) compares the pulse count (N) 638 from the counter 136 to the first trigger count value $N_{T1}$ 714 loaded into the trigger register 614. When the comparator 616 determines that the pulse count (N) 638 matches the first trigger count value $N_{T1}$ 714, the comparator 616 toggles the trigger (SENB) signal 722 to assert the strobe (STB) line 646 of the sense amplifiers 112 (FIG. 1) to cause the sense amplifiers 112 to latch binary values corresponding to the voltages across corresponding integrating capacitors (e.g., the integrating capacitor $C_{INT}$ 602). For example, a binary value of one '1' is latched for voltages across integrating capacitors $C_{INT}$ that exceed a trip voltage level of the sense amplifiers 112, and a binary value of zero '0' is latched for voltages across integrating capacitors $C_{INT}$ that do not exceed a trip voltage level of the sense amplifiers 112. In the illustrated example, the logical values latched by the sense amplifiers 112 based on the first trigger count value $N_{T1}$ 714 are stored in the first primary data cache (PDC1) 116 (FIGS. 1 and 6).

After latching binary values based on the first trigger count value $N_{T1}$ 714, the second trigger count value $N_{T2}$ 716 is loaded into the trigger register 614. As integrating capacitor charges continue to develop over time, the comparator 616 compares the pulse count (N) 638 from the counter 136 to the second trigger count value $N_{T2}$ 716 loaded into the trigger register 614. When the comparator 616 determines that the pulse count (N) 638 matches the second trigger count value $N_{T2}$ 716, the comparator 616 toggles the trigger (SENB) signal 722 to assert the strobe (STB) line 646 of the sense amplifiers 112 (FIG. 1) to cause the sense amplifiers 112 to latch binary values corresponding to the voltage across corresponding integrating capacitors (e.g., the integrating capacitor $C_{INT}$ 602). For example, a binary value of one '1' is latched for voltages across integrating capacitors $C_{INT}$ that exceed a trip voltage level of the sense amplifiers 112, and a binary value of zero '0' is latched for voltages across integrating capacitors $C_{INT}$ that do not exceed a trip voltage level of the sense amplifiers 112. In the illustrated example, the logical values latched by the sense amplifiers 112 based on the second trigger count value $N_{T2}$ 716 are stored in the second primary data cache (PDC2) 118 (FIGS. 1 and 6).

After latching binary values based on the second trigger count value $N_{T2}$ 716, the example programmed state detector 626 obtains the latched binary values from the first and second primary data caches 116, 118 to determine programmed states of the target memory cells. For example, the programmed state detector 626 determines that binary ones '1' in the first primary data cache (PDC1) 116 correspond to target memory cells with programmed threshold voltages ($V_T$) in the third programmed state zone Z3. For example, the target memory cells with programmed threshold voltages ($V_T$) in the third programmed state zone Z3 have a relatively high memory cell electrical current ($I_{CELL}$) to charge corresponding integrating capacitors ($C_{INT}$) above the trip voltage level of the sense amplifiers 112 before the pulse count (N) 638 reaches the first trigger count value $N_{T1}$ 714.

The programmed state detector 626 performs logical comparison operations (e.g., logical XOR operations) between bits in the primary and secondary data caches 116, 118 to determine target memory cells having programmed threshold voltages ($V_T$) in the second programmed state zone Z2. For example, the programmed state detector 626 determines that bit locations having binary zeros '0' in the first primary data cache (PDC1) 116 and binary ones '1' in the second primary data cache (PDC2) 118 correspond to target memory cells with programmed threshold voltages ($V_T$) in the second programmed state zone Z2. For example, the target memory cells with programmed threshold voltages ($V_T$) in the second programmed state zone Z2 have a relatively smaller memory cell electrical current ($I_{CELL}$) that requires more time to charge corresponding integrating capacitors ($C_{INT}$) such that the voltages on the integrating capacitors ($C_{INT}$) do not exceed the trip voltage level of the sense amplifiers 112 until after the pulse count (N) 638 exceeds the first trigger count value $N_{T1}$ 714 and before the pulse count (N) 638 reaches the second trigger count value $N_{T2}$ 716.

Based on the logical comparison operations, the example programmed state detector 626 also determines that bit locations having binary zeros '0' in the first primary data cache (PDC1) 116 and binary zeros '0' in the second primary data cache (PDC2) 118 correspond to target memory cells with programmed threshold voltages ($V_T$) in the first programmed state zone Z1. For example, the target memory cells with programmed threshold voltages ($V_T$) in the first programmed state zone Z1 have a relatively small memory cell electrical current ($I_{CELL}$) that requires more time to charge corresponding integrating capacitors ($C_{INT}$) such that the voltages on the integrating capacitors ($C_{INT}$) do not exceed the trip voltage level of the sense amplifiers 112 until after the pulse count (N) 638 exceeds the second trigger count value $N_{T2}$ 716.

FIG. 7C is an example program pulse-type table 730 showing types of program pulses needed for corresponding target memory cells to reach a target threshold voltage ($V_{TT}$) during a memory cell programming phase. After the example programmed state detector 626 determines the programmed state zones Z1, Z2, Z3 of the target memory cells based on binary values latched by the sense amplifiers 112 as discussed above in connection with FIG. 7B, the output analyzer 628 (FIG. 6) uses the program pulse-type table 730 in connection with the identified programmed state zones Z1, Z2, Z3 of the target memory cells to determine program pulse-types for the target memory cells. For example, the output analyzer 628 determines that target memory cells in the third programmed state zone Z3 need a full PGM program pulse during a next programming pass to move the programmed threshold voltages ($V_T$) of those target memory cells closer to the target threshold voltage ($V_{TT}$) 706. The example output analyzer 628 determines that target memory cells in the second programmed state zone Z2 need a partial SSPC program pulse during a next programming pass to move the programmed threshold voltages ($V_T$) of those target memory cells closer to the target threshold voltage ($V_{TT}$) 706. In addition, the example output analyzer 628 determines that target memory cells in the first programmed state zone Z1 are to be inhibited INH from receiving any further programming pulse during a next programming pass because those target memory cells are already at the target threshold voltage ($V_{TT}$) 706. Based on the program pulse-types determined by the output analyzer using the program pulse-type table 730, the voltage controller 622 can control voltage levels of the programming pulses used to perform further programming passes on the target memory cells.

Figure 8:
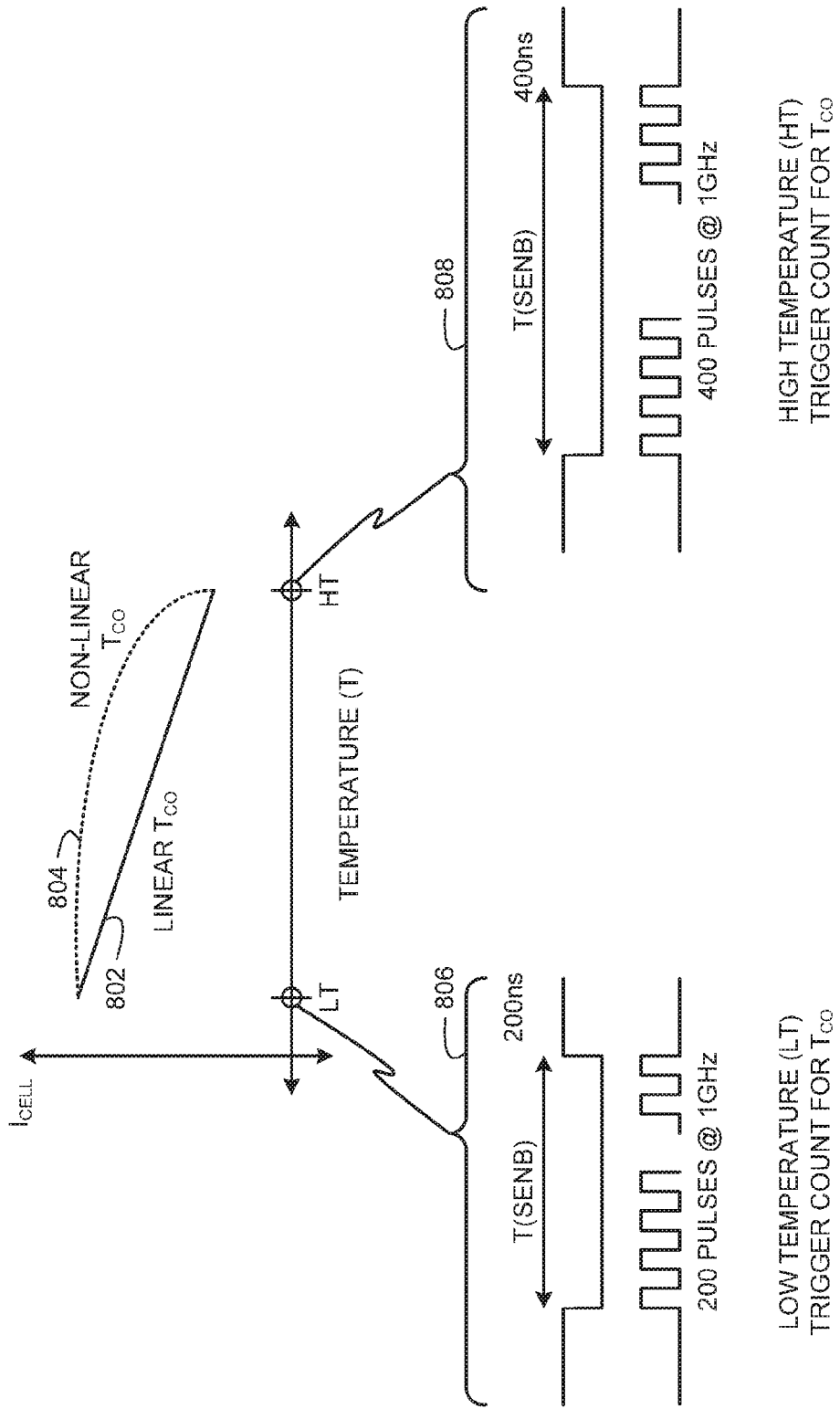
FIG. 8 depicts different example pulse counts for acquiring programmed states of memory cells based on the effects of a temperature coefficient ($T_{CO}$) of a dielectric material on memory cell electrical current ($I_{CELL}$) over a temperature range in the dielectric material.

FIG. 8 depicts different example pulse counts for acquiring programmed states of memory cells 106 (FIG. 1) based on the effects of a temperature coefficient ($T_{CO}$) of a dielectric material on memory cell electrical current ($I_{CELL}$) over temperature in the dielectric material. For example, as the dielectric material of the memory cell transistor 204 (FIGS. 2 and 6) undergoes temperatures changes, a temperature coefficient ($T_{CO}$) of the transistor 204 affects the electrical current through the memory cell transistor 204. For example, the memory cell electrical current ($I_{CELL}$) 206 (FIGS. 2 and 6) of the transistor 204 is affected by the temperature changes. In some examples, the flash memory 104 may undergo significant temperature changes depending on the memory access load on the flash memory 204 (e.g., the flash memory 104 may dissipate significant heat during heavy data access), on temperatures of nearby components on the same circuit board, and/or on environmental temperatures. In some instances, significant temperature changes may cause inaccurate readings of memory cell programmed states due to the temperature's effects on the memory cell electrical current ($I_{CELL}$) 206. To substantially reduce or eliminate the likelihood of temperature changes causing inaccurate memory cell readings, examples disclosed herein may use temperature as a criterion for selecting trigger count values ($N_{Tn}$) 642 (FIG. 6) for detecting programmed states of the memory cells 106.

As shown in FIG. 8, a temperature coefficient ($T_{CO}$) of a dielectric material can be linear 802 or non-linear 804. Suitable trigger count values ($N_{Tn}$) 642 can be determined in advance for different temperatures in the temperature operating ranges of memories having linear temperature coefficients ($T_{CO}$) 802 or non-linear temperature coefficients ($T_{CO}$) 804 and stored in the memories or associated memory controllers for selecting during read operations of those memories. For example, the trigger value store 618 of FIG. 6 may store temperature values in the characteristic values $CR_{Tn}$ 650 in association with corresponding ones of the trigger count values ($N_{Tn}$) 642. In this manner, during a read operation, the criterion condition detector 624 can detect a temperature (e.g., using an in-die or on-board thermocouple) of the flash memory 104 and/or a memory cell array in the flash memory 104, and the trigger value retriever 620 can use the observed temperature to retrieve a trigger count value ($N_{Tn}$) 642. By using temperature as a criterion characteristic of the flash memory 104, readings of the flash memory 104 can be made with substantially the same accuracy over temperature changes.

In the illustrated example of FIG. 8, a low temperature (LT) trigger count 806 is shown as having a sense time ($t_{sen}$) of 200 nanoseconds (ns) that is tracked with 200 pulses of a 1 gigahertz (1 GHz) clock (e.g., N=200, $T_{clk}$=1 ns). Also in the example of FIG. 8, a high temperature (HT) trigger count 808 is shown as having a sense time of 400 ns that is tracked with 400 pulses of the 1 GHz clock (e.g., N=400, $T_{clk}$=1 ns). As such, the illustrated example of FIG. 8 shows that as temperature of a memory device increases, the temperature coefficients ($T_{CO}$) depicted in FIG. 8 cause a decrease in the memory cell electrical current ($I_{CELL}$) 206 in those memory devices. The decreased memory cell electrical current ($I_{CELL}$) 206 as temperature increases causes integrating capacitors (e.g., the integrating capacitor ($C_{INT}$) 602 of FIG. 6) to develop sensing voltages at a slower rate. As such, during higher operating temperatures, more time (e.g., more pulse counts (N)) is needed to sense programmed states of the same memory cells. Higher memory cell electrical current ($I_{CELL}$) 206 for lower temperatures causes integrating capacitors (e.g., the integrating capacitor ($C_{INT}$) 602 of FIG. 6) to develop sensing voltages at a faster rate. As such, during lower operating temperatures, less time (e.g., less pulse counts (N)) is needed to sense programmed states of the same memory cells.

Figure 9:
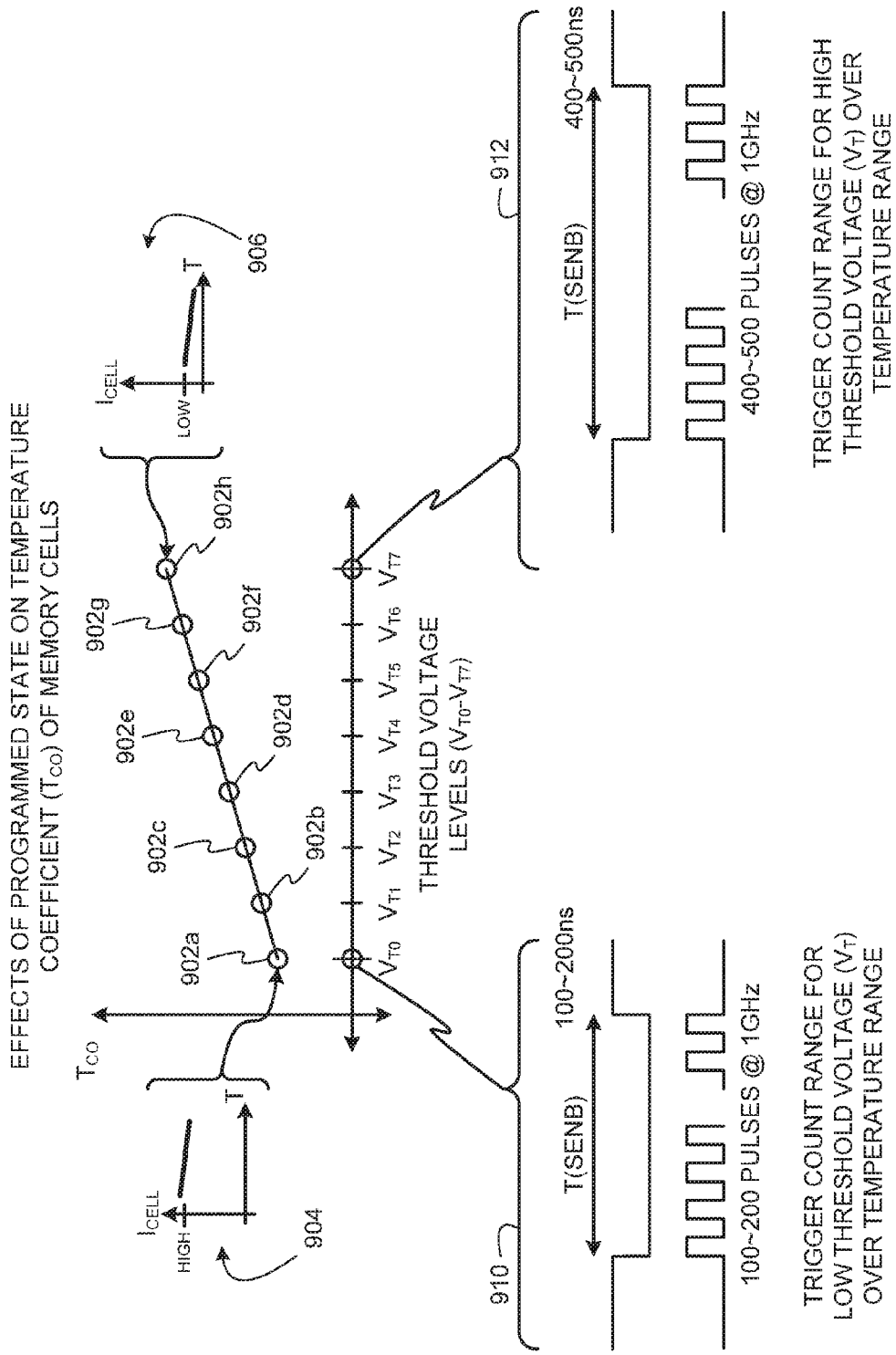
FIG. 9 depicts different example pulse counts for acquiring programmed states of memory cells based on the effects of a temperature coefficient ($T_{CO}$) of a dielectric material on memory cell electrical current ($I_{CELL}$) over different memory cell programmed states.

FIG. 9 depicts different example pulse counts for acquiring programmed states of memory cells 106 based on the effects of memory cell programmed states (e.g., memory cell threshold voltages ($V_T$)) on a temperature coefficient ($T_{CO}$) (e.g., a programmed state-dependent temperature coefficient ($T_{CO}$)) of a dielectric material of the memory cells 106. The illustrated example of FIG. 9 shows different threshold voltage levels $V_{T0}$, $V_{T1}$, $V_{T2}$, $V_{T3}$, $V_{T4}$, $V_{T5}$, $V_{T6}$, and $V_{T7}$. In the illustrated example, as a threshold voltage ($V_T$) of a memory cell 106 increases (e.g., from threshold voltage level $V_{T0}$ to threshold voltage level $V_{T7}$), the temperature coefficient ($T_{CO}$) of the memory cell 106 also increases. For example, different temperature coefficients ($T_{CO}$) 902a-h are shown for different threshold voltage levels $V_{T0}$-$V_{T7}$. Each of the temperature coefficients ($T_{CO}$) 902a-h causes different changes in the memory cell electrical current ($I_{CELL}$) over a temperature range. For example, when a memory cell 106 is programmed to one of the threshold voltage levels $V_{T0}$-$V_{T7}$, a corresponding one of the temperature coefficients ($T_{CO}$) 902a-h of the programmed threshold voltage level causes the memory cell electrical current ($I_{CELL}$) through the programmed memory cell 106 to change over a temperature range in a different manner and at different electrical current levels than if the memory cell 106 were programmed to another one of the threshold voltage levels $V_{T0}$-$V_{T7}$ corresponding to a different one of the temperature coefficients ($T_{CO}$) 902a-h.

Examples of different changes in memory cell electrical current ($I_{CELL}$) over a temperature range based on the temperature coefficient ($T_{CO}$) 902a corresponding to the zeroeth threshold voltage $V_{T0}$ is shown in a memory cell electrical current ($I_{CELL}$) vs. temperature graph 904. Examples of different changes in memory cell electrical current ($I_{CELL}$) over a temperature range based on the temperature coefficient ($T_{CO}$) 902h corresponding to the seventh threshold voltage $V_{T7}$ is shown in a memory cell electrical current ($I_{CELL}$) vs. temperature graph 906. As shown in the illustrated examples of the current vs. temperature graphs 904, 906, memory cell electrical current ($I_{CELL}$) is higher for lower temperature coefficients ($T_{CO}$) corresponding to lower threshold voltages ($V_T$), and the memory cell electrical current ($I_{CELL}$) decreases as the temperature coefficient ($T_{CO}$) increases for higher threshold voltages ($V_T$). Because higher levels of memory cell electrical current ($I_{CELL}$) cause sensing voltages to develop faster on integrating capacitors (e.g., the integrating capacitor $C_{INT}$ 602 of FIG. 6) than lower levels of memory cell electrical current ($I_{CELL}$), less time is needed for the sensing voltages on the integrating capacitors to exceed trip voltages of the sense amplifiers 112 when memory cells are programmed to lower threshold voltages ($V_T$) corresponding to lower temperature coefficients ($T_{CO}$). Also, more time is needed for the sensing voltages on the integrating capacitors to exceed trip voltages of the sense amplifiers 112 when memory cells are programmed to higher threshold voltages ($V_T$) corresponding to higher temperature coefficients ($T_{CO}$). Example Table 1 below shows an example data structure storing different ranges of trigger count values ($N_{(VT,T)}$) for the threshold voltage levels $V_{T0}$-$V_{T7}$ over a temperature range ($T_0$-$T_3$).

TABLE 1

Trigger Count Values (N) over Temperature (T) for Different Threshold Voltages ($V_T$) and corresponding Temperature Coefficients ($T_{CO}$)

| | $V_{T0}$ ($T_{CO0}$) | $V_{T1}$ ($T_{CO1}$) | $V_{T2}$ ($T_{CO2}$) | $V_{T3}$ ($T_{CO3}$) | $V_{T4}$ ($T_{CO4}$) | $V_{T5}$ ($T_{CO5}$) | $V_{T6}$ ($T_{CO6}$) | $V_{T7}$ ($T_{CO7}$) |
|---|---|---|---|---|---|---|---|---|
| Temp0 (T0) | $N_{(0,0)}$ | $N_{(0,1)}$ | $N_{(0,2)}$ | $N_{(0,3)}$ | $N_{(0,4)}$ | $N_{(0,5)}$ | $N_{(0,6)}$ | $N_{(0,7)}$ |
| Temp1 (T1) | $N_{(1,0)}$ | $N_{(1,1)}$ | $N_{(1,2)}$ | $N_{(1,3)}$ | $N_{(1,4)}$ | $N_{(1,5)}$ | $N_{(1,6)}$ | $N_{(1,7)}$ |
| Temp2 (T2) | $N_{(2,0)}$ | $N_{(2,1)}$ | $N_{(2,2)}$ | $N_{(2,3)}$ | $N_{(2,4)}$ | $N_{(2,5)}$ | $N_{(2,6)}$ | $N_{(2,7)}$ |
| Temp3 (T3) | $N_{(3,0)}$ | $N_{(3,1)}$ | $N_{(3,2)}$ | $N_{(3,3)}$ | $N_{(3,4)}$ | $N_{(3,5)}$ | $N_{(3,6)}$ | $N_{(3,7)}$ |

In the illustrated example of Table 1 above, a different range of trigger count values ($N_{(VT, T)}$) is used over the temperature range (T0-T3) for each threshold voltage $V_{T0}$-$V_{T7}$ and corresponding temperature coefficient ($T_{CO}$) 902a-h. In example Table 1, the zeroeth threshold voltage $V_{T0}$ is a lower voltage level than the seventh threshold voltage $V_{T7}$, a zeroeth temperature T0 is lower than a third temperature T3, and trigger count values ($N_{(0,0)}$, $N_{(1,0)}$, $N_{(2,0)}$, $N_{(3,0)}$) corresponding to the zeroeth threshold voltage $V_{T0}$ are in a lower count range (e.g., less durations for developing a sense voltage on the integrating capacitor ($C_{INT}$) 604 of FIG. 6) than trigger count values ($N_{(0,7)}$, $N_{(1,7)}$, $N_{(2,7)}$, $N_{(3,7)}$) corresponding to the seventh threshold voltage $V_{T7}$. For example, for the zeroeth threshold voltage $V_{T0}$ (e.g., corresponding to the memory cell electrical current ($I_{CELL}$) vs. temperature graph 904 of FIG. 9), the different trigger count values ($N_{(0,0)}$, $N_{(1,0)}$, $N_{(2,0)}$, $N_{(3,0)}$) are used as memory cell temperature increases from the zeroeth temperature (T0) to the third temperature (T3). In addition, for the seventh threshold voltage $V_{T7}$ (e.g., corresponding to the memory cell electrical current ($I_{CELL}$) vs. temperature graph 906 of FIG. 9), the different trigger count values ($N_{(0,7)}$, $N_{(1,7)}$, $N_{(2,7)}$, $N_{(3,7)}$) are used as memory cell temperature increases from the zeroeth temperature (T0) to the third temperature (T3). As such, memory cells programmed to lower threshold voltages ($V_T$) can be read over a range of operating temperatures using lower ranges of pulse counts (N), and higher threshold voltages ($V_T$) can be read over a range of operating temperatures using higher ranges of pulse counts (N).

Suitable trigger count values ($N_{Tn}$) 642 of FIG. 6 can be determined in advance for different threshold voltages ($V_T$) (e.g., the threshold voltages $V_{T0}$-$V_{T7}$ of FIG. 9 and Table 1 above) of memories based on their temperature coefficients ($T_{CO}$) (e.g., the temperature coefficients 9-2a-h of FIG. 9 shown as $T_{CO0}$-$T_{CO7}$ in Table 1 above). The trigger count values ($N_{Tn}$) 642 can be stored in the memories or associated memory controllers for selecting during read operations of those memories. For example, for each threshold voltage ($V_{Tn}$) 644 (FIG. 6), the trigger value store 618 of FIG. 6 may store ranges of trigger count values ($N_{Tn}$) 642 (e.g., the trigger count values $N_{(0,0)}$ . . . $N_{(3,7)}$ of Table 1 above) in association with different temperatures (e.g., temperatures T0-T3 of Table 1 above stored as the characteristic values $CR_{Tn}$ 650). In this manner, during a read operation, the criterion condition detector 624 can detect a temperature (e.g., using an in-die or on-board thermocouple) of the flash memory 104 and/or a memory cell array in the flash memory 104, and the trigger value retriever 620 can retrieve a corresponding trigger count value ($N_{Tn}$) 642 for a corresponding threshold voltage ($V_{Tn}$) 644 at a particular temperature. By using different trigger count values ($N_{Tn}$) 642 for different threshold voltages ($V_{Tn}$) 644 and temperatures based on temperature coefficients ($T_{CO}$) of memories, readings of the flash memory 104 can be made with substantially the same accuracy over different temperatures in an operating temperature range for different programmed threshold voltages ($V_T$) of the memory cells 106.

In the illustrated example of FIG. 9, an example temperature-dependent trigger count range 910 for a low threshold voltage level ($V_{T0}$) is shown as having a sense time ($t_{sen}$) range of 100~200 nanoseconds (ns) that is tracked with 100~200 pulses of a 1 gigahertz (1 GHz) clock (e.g., N=100~200, $T_{clk}$(=1 ns). Also in the example of FIG. 9, an example temperature-dependent trigger count 912 for a high threshold voltage level ($V_{T7}$) is shown as having a sense time ($t_{sen}$) range of 400~500 ns that is tracked with 400~500 pulses of the 1 GHz clock (e.g., N=400~500, $T_{clk}$ (=1 ns). As such, the illustrated example of FIG. 9 shows that for lower threshold voltage levels ($V_T$), the temperature coefficients ($T_{CO}$) depicted in FIG. 9 cause overall higher ranges of memory cell electrical current ($I_{CELL}$) 206 over an operating temperature range. The higher memory cell electrical current ($I_{CELL}$) 206 for lower threshold voltages ($V_T$) causes integrating capacitors (e.g., the integrating capacitor ($C_{INT}$) 602 of FIG. 6) to develop sensing voltages at a faster rate. As such, when sensing lower threshold voltages ($V_T$), less time (e.g., less pulse counts (N)) is needed to sense programmed states of memory cells. Lower memory cell electrical current ($I_{CELL}$) 206 for higher threshold voltages ($V_T$) causes integrating capacitors (e.g., the integrating capacitor ($C_{INT}$) 602 of FIG. 6) to develop sensing voltages at a slower rate. As such, when sensing higher threshold voltages ($V_T$), more time (e.g., more pulse counts (N)) is needed to sense programmed states of memory cells.

Figure 10A:
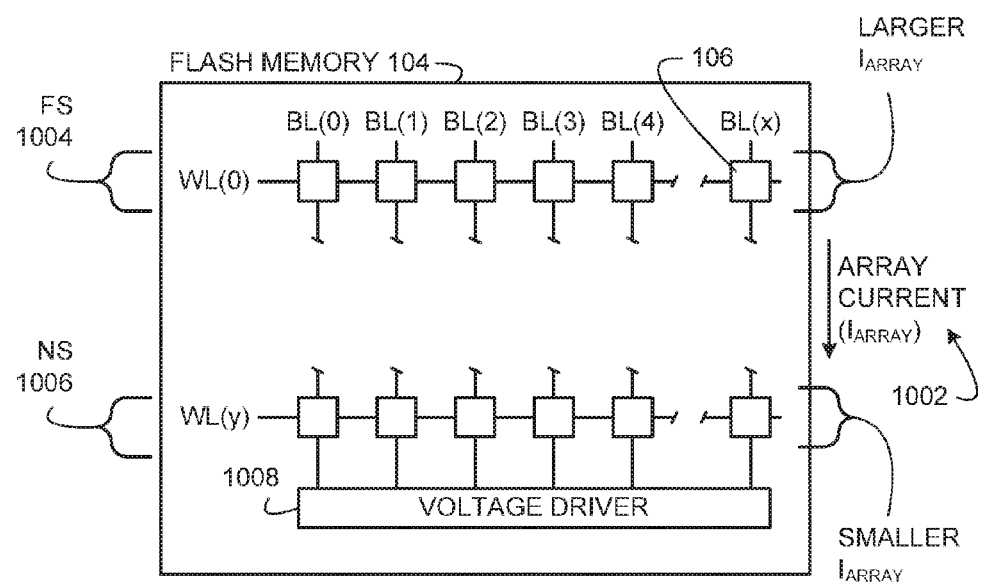
FIG. 10A shows the variation in electrical current through a memory cell array ($I_{ARRAY}$) in the flash memory of FIG. 1 relative to locations of the memory cells in the flash memory.
Figure 10B:
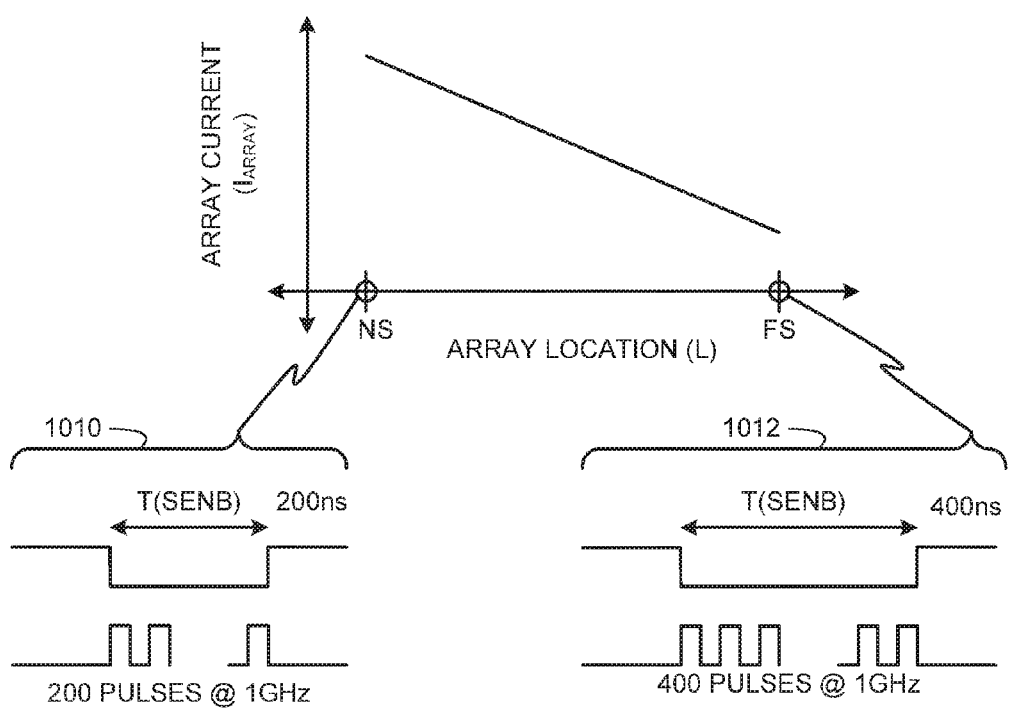
FIG. 10B depicts different example pulse counts for sensing programmed states of memory cells based on the effects of memory cell array locations on array current ($I_{ARRAY}$) through the memory cells.

FIG. 10A shows the variation in electrical current through a memory cell array ($I_{ARRAY}$) 1002 in the flash memory 104 of FIG. 1 relative to memory cell array locations of tiles that include the memory cells 106 in the flash memory 104. In the illustrated example, the memory cell array locations of the memory cells 106 range between a far-side (FS) location 1004 and a near-side (NS) location 1006 relative to a voltage driver 1008 that applies voltages to the wordlines (WL(y)), bitlines (BL(y)), and source line (src) of the flash memory 104. FIG. 10B depicts different example pulse counts for sensing programmed states of the memory cells 106 based on the effects of memory cell array locations on the array current ($I_{ARRAY}$) 1002 through the memory cells 106. The illustrated examples of FIGS. 10A and 10B show that the array current ($I_{ARRAY}$) 1002 through memory cells 106 is lower for memory cells 106 farther from the voltage driver 1008 (e.g., memory cells 106 located at or closer to the FS location 1004). The array current ($I_{ARRAY}$) 1002 through memory cells 106 is higher for memory cells 106 closer to the voltage driver 1008 (e.g., memory cells 106 located at or closer to the NS location 1006).

In the illustrated examples of FIGS. 10A and 10B, the array current ($I_{ARRAY}$) 1002 is representative of memory cell electrical currents ($I_{CELL}$) through the memory cells 106 that charge integrating capacitors ($C_{INT}$) (e.g., the integrating capacitor ($C_{INT}$) 602 of FIG. 6) in the sense amplifiers 112 to sense the programmed states of the memory cells. Suitable trigger count values ($N_{Tn}$) 642 can be determined in advance for different memory cell array locations of memories and stored in the memories or associated memory controllers for selecting during read operations of those memories. For example, the trigger value store 618 of FIG. 6 may store array location values in the characteristic values $CR_{Tn}$ 650 in association with corresponding ones of the trigger count values ($N_{Tn}$) 642. In this manner, during a read operation, the criterion condition detector 624 can detect a memory array location of a row (e.g., a wordline) of memory cells 106 of the flash memory 104 (e.g., using a wordline address decoder), and the trigger value retriever 620 can use the observed array location to retrieve one or more corresponding trigger count value(s) ($N_{Tn}$) 642. By using memory cell array location as a criterion characteristic of the flash memory 104, readings of the flash memory 104 can be made with substantially the same accuracy regardless of memory cell array locations in the flash memory 104.

In the illustrated example of FIG. 10B, an example trigger count 1010 for the NS location 1006 is shown as having a sense time ($t_{sen}$) of 200 nanoseconds (ns) that is tracked with 200 pulses of a 1 gigahertz (1 GHz) clock (e.g., N=200, $T_{clk}$ (=1 ns). Also in the example of FIG. 10B, an example trigger count 1012 for a FS location 1004 is shown as having a sense time of 400 ns that is tracked with 400 pulses of the 1 GHz clock (e.g., N=400, $T_{clk}$=1 ns). As such, the illustrated example of FIG. 10B shows that memory cells 106 located closer to the voltage driver 1008 have higher memory cell electrical current ($I_{CELL}$) 206 (FIGS. 2 and 6). The higher memory cell electrical current ($I_{CELL}$) 206 for memory cells 106 located closer to the voltage driver 1008 causes integrating capacitors (e.g., the integrating capacitor ($C_{INT}$) 602 of FIG. 6) to develop sensing voltage at a faster rate than memory cell electrical current ($I_{CELL}$) 206 of memory cells 106 located farther from the voltage driver 1008. As such, when sensing programmed states of memory cells 106 closer to the voltage driver 1008, less time (e.g., less pulse counts (N)) is needed to sense the programmed states. Lower memory cell electrical current ($I_{CELL}$) 206 for memory cells 106 further from the voltage driver 1008 causes integrating capacitors (e.g., the integrating capacitor ($C_{INT}$) 602 of FIG. 6) to develop sensing voltage at a slower rate than memory cell electrical current ($I_{CELL}$) 206 of memory cells 106 located closer to the voltage driver 1008. As such, when sensing programmed states of memory cells 106 farther from the sense amplifiers 112, more time (e.g., more pulse counts (N)) is needed to sense the programmed states.

Figure 11A:
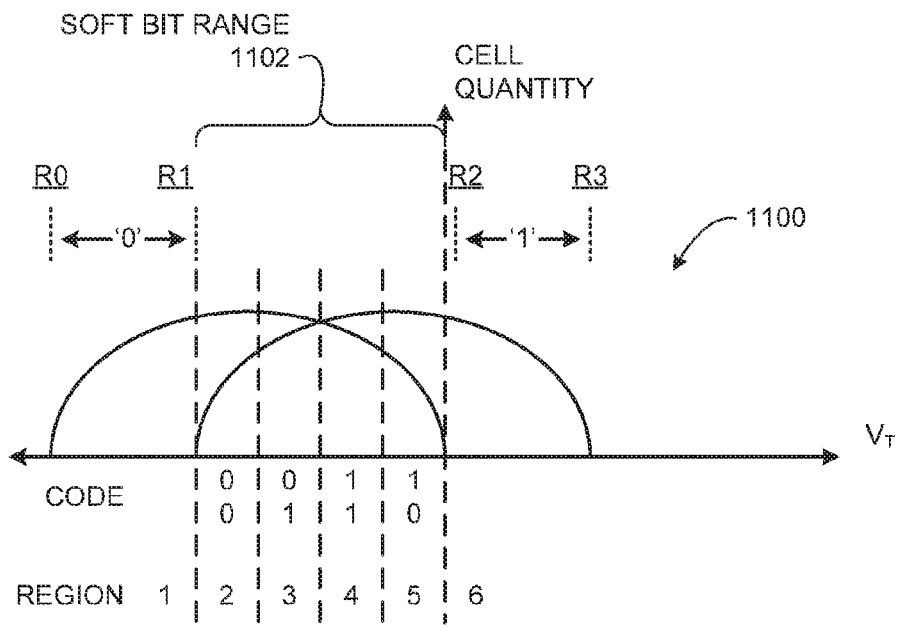
FIG. 11A depicts a programmed state distribution of memory cells of the flash memory of FIG. 1 in connection with observed soft bit information of the memory cells.
Figure 11B:
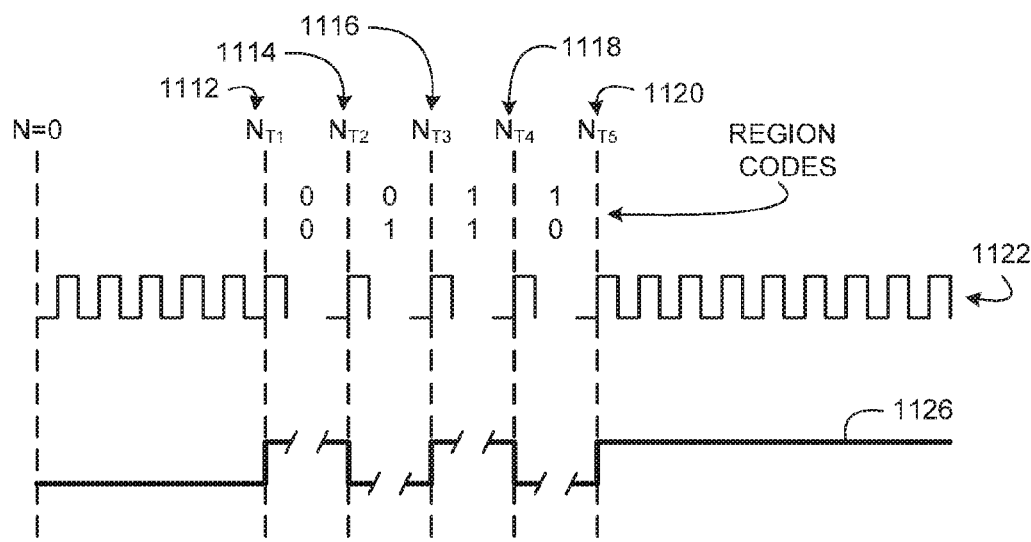
FIG. 11B depicts pulse count-based triggers to acquire the soft bit information of memory cells shown in connection with the programmed state distribution of FIG. 11A.

FIG. 11A depicts a programmed state distribution 1100 of memory cells 106 of the flash memory 104 of FIG. 1 in connection with observed soft bit information of the memory cells 106. The programmed state distribution 1100 of FIG. 11A represents a threshold voltage ($V_T$) distribution of the memory cells 106. FIG. 11B depicts pulse count-based triggers to acquire the soft bit information of the memory cells 106 shown in connection with the programmed state distribution 1100 of FIG. 11A. The soft bit information represented in FIG. 11A corresponds to ones of the memory cells 106 having programmed states that are not clearly within a particular threshold voltage ($V_T$) range to accurately identify data stored in those memory cells 106. For example, a threshold voltage ($V_T$) range corresponding to a stored binary zero '0' may be between a first lower boundary reference voltage (R0) (FIG. 11A) of 0.5 volts and a first upper boundary reference voltage (R1) (FIG. 11A) of 1.5 volts, and a threshold voltage ($V_T$) range corresponding to a stored binary one '1' may be between a second lower boundary reference voltage (R2) (FIG. 11A) of 2.0 volts and a second upper boundary reference voltage (R3) (FIG. 11A) of 3.5 volts. (In the example of FIG. 11A, the voltage separation between the first upper boundary reference voltage (R1) and the second lower boundary reference voltage (R3) is shown out of scale to more clearly see the detail of the threshold voltage distribution between those two boundary reference voltages.)

Over time the flash memory 104 may degrade or otherwise undergo changes to its electrical properties. Under such circumstances, ranges of threshold voltages ($V_T$) that represent stored information may shift such that a threshold voltage ($V_T$) distribution of the flash memory 104 loses its accuracy in representing the stored information. For example, as shown in FIG. 11A, programmed threshold voltages ($V_T$) of memory cells are between the first upper boundary reference voltage (R1) corresponding to a stored binary zero '0' and the second lower boundary reference voltage (R2) corresponding to a stored binary one '1'. As such, memory cells 106 having programmed threshold voltages ($V_T$) in a soft bit range 1102 that is between the first upper boundary reference voltage (R1) and the second lower boundary reference voltage (R2) are referred to as storing soft bits because their programmed threshold voltages ($V_T$) do not accurately represent information intended to be stored therein. To avoid losing such stored information, reference voltages (e.g., R0, R1, R2, R3) defining the range boundaries of threshold voltage ($V_T$) ranges may be changed to align the threshold voltage ($V_T$) distribution of the flash memory 104 to accurately correspond to the stored information.

The soft bit information of FIG. 11A is used to group threshold voltages ($V_T$) of memory cells 106 into different regions shown as Regions 1-6. In the illustrated example, each of the Regions 1-6 is identified using a two-bit binary code (e.g., binary codes 00, 01, 11, 10). If a different number of regions are used for grouping soft bit information, binary codes with fewer or more bits may be used to identify those regions. In the illustrated example of FIG. 11A, memory cells 106 having programmed threshold voltages ($V_T$) in Region 1 accurately represent a stored binary zero '0', and memory cells having programmed threshold voltages ($V_T$) in Region 6 accurately represent a stored binary one '1'. Memory cells 106 having programmed threshold voltages ($V_T$) in Regions 2-5 are in the soft bit range 1102 and do not accurately store a binary zero '0' or a binary one '1'. To determine where larger concentrations of memory cells 106 reside in the soft bit range 1102, examples disclosed herein can be used to sense programmed threshold voltages ($V_T$) based on pulse count triggers ($N_T$) (e.g., the pulse count triggers ($N_{Tn}$) 642 of FIG. 6) as described below in connection with FIG. 11B.

FIG. 11B depicts trigger count values $N_{T1}$ 1112, $N_{T2}$ 1114, $N_{T3}$ 1116, $N_{T4}$ 1118, and $N_{T5}$ 1120 to acquire the programmed states of target memory cells 106 shown in the programmed state distribution 1100 of FIG. 11A. FIG. 11B also shows an example clock signal 1122 provided by, for example, the clock 636 of FIG. 6. The example clock signal 1122 drives the example counter 136 (FIGS. 1 and 6) to generate the pulse counts (N) 638 of FIG. 6. FIG. 11B also shows an example trigger (SENB) signal 1126 (e.g., the SENB signal 644 of FIG. 6) that may be provided by the example comparator 616 of FIG. 6 to assert the strobe (STB) line 646 of the sense amplifier 112 of FIG. 6. In the illustrated example, the strobe (STB) line 646 of the sense amplifier 112 is a level-triggered line for which a low level (e.g., as shown on the example trigger (SENB) signal 722 of FIG. 7) asserts the strobe (STB) line 646 to cause the sense amplifier 112 to latch values.

In the illustrated example, the trigger count values $N_{T1}$ 1112, $N_{T2}$ 1114, $N_{T3}$ 1116, $N_{T4}$ 1118, and $N_{T5}$ 1120 are loaded into the trigger registers 614 (FIG. 6), and the pulse count (N) 638 starts at zero (N=0). When the voltage controller 622 (FIG. 6) activates target memory cells for reading/sensing their programmed threshold voltages ($V_T$), the counter 136 starts incrementing/accumulating the pulse count (N) 638. When the target memory cells are activated by the voltage controller 622 by applying the wordline read-verify voltage ($V_{WLRV}$) 214 (FIG. 2) to a corresponding wordline (WL) and by precharging corresponding bitlines (BL) with the bitline precharge voltage ($V_{bl}$) 604 (FIG. 6), memory cell electrical currents ($I_{CELL}$) begin to flow through the target memory cells, which causes sensing voltages to develop at corresponding integrating capacitors (e.g., the integrating capacitor ($C_{INT}$) 602 of FIG. 6). As integrating capacitor sensing voltages develop over time, the comparator 616 (FIG. 6) compares the pulse count (N) 638 from the counter 136 to the first trigger count value $N_{T1}$ 1112 loaded into the trigger register 614. When the comparator 616 determines that the pulse count (N) 638 matches the first trigger count value $N_{T1}$ 1112, the comparator 616 toggles the trigger (SENB) signal 1126 to assert the strobe (STB) line 646 of the sense amplifiers 112 (FIG. 1) to cause the sense amplifiers 112 to latch binary values corresponding to the sensing voltage across corresponding integrating capacitors (e.g., the integrating capacitor $C_{INT}$ 602). For example, a binary value of one '1' is latched for sensing voltages across integrating capacitors $C_{INT}$ that exceed a trip voltage level of the sense amplifiers 112, and a binary value of zero '0' is latched for sensing voltages across integrating capacitors $C_{INT}$ that do not exceed a trip voltage level of the sense amplifiers 112. In the illustrated example, the logical values latched by the sense amplifiers 112 based on the first trigger count value $N_{T1}$ 1112 are stored in a corresponding data cache (e.g., one of the data caches 114, 116, 118 of FIGS. 1 and 6). Similarly, for each of the trigger count values $N_{T1}$ 1112, $N_{T2}$ 1114, $N_{T3}$ 1116, $N_{T4}$ 1118, and $N_{T5}$ 1120, the comparator 616 toggles the trigger (SENB) signal 1126 to assert the strobe (STB) line 646 of the sense amplifiers 112 to cause the sense amplifiers 112 to latch binary values corresponding to the sensing voltages across corresponding integrating capacitors (e.g., the integrating capacitor $C_{INT}$ 602) as sensing voltages continue to develop in the integrating capacitors over time. After each latch event of the sense amplifiers 112, the sense amplifiers 112 store the latched values into a corresponding data cache. Although only three data caches 114, 116, 118 are shown in FIGS. 1 and 6, more data caches may be employed to separately store the binary values latched by the sense amplifiers 112 after each of the trigger count values $N_{T1}$ 1112, $N_{T2}$ 1114, $N_{T3}$ 1116, $N_{T4}$ 1118, and $N_{T5}$ 1120 is reached by the pulse count (N) 638.

In the illustrated example, after storing the binary values latched by the sense amplifier 112, the example programmed state detector 626 obtains the latched binary values from the data caches to determine programmed states of the target memory cells. For example, the programmed state detector 626 performs logical comparison operations (e.g., logical XOR operations) between bits latched at the first trigger count value $N_{T1}$ 1112 and bits latched at the second trigger count value $N_{T2}$ 1114 to determine target memory cells having programmed threshold voltages ($V_T$) in Region 2 (FIG. 11A) corresponding to binary region code '00'. Using such logical comparison operations, the programmed state detector 626 determines that bit locations having binary zeros '0' latched at the first trigger count value $N_{T1}$ 1112 and binary ones '1' latched at the second trigger count value $N_{T2}$ 1114 correspond to target memory cells with programmed threshold voltages ($V_T$) in Region 2 corresponding to binary region code '00'. For example, the target memory cells with programmed threshold voltages ($V_T$) in Region 2 have a memory cell electrical current ($I_{CELL}$) that charges corresponding integrating capacitors ($C_{INT}$) at a rate that the sensing voltages on the integrating capacitors ($C_{INT}$) do not exceed the trip voltage level of the sense amplifiers 112 until after the pulse count (N) 638 exceeds the first trigger count value $N_{T1}$ 1112 and before the pulse count (N) 638 reaches the second trigger count value $N_{T2}$ 1114.

Based on the logical comparison operations associated with the soft bit extraction of FIG. 11B, the example programmed state detector 626 also determines that bit locations having binary zeros '0' latched at the second trigger count value $N_{T2}$ 1114 and binary ones '1' latched at the third trigger count value $N_{T3}$ 1116 correspond to target memory cells with programmed threshold voltages ($V_T$) in Region 3 corresponding to binary region code '01'. For example, the target memory cells with programmed threshold voltages ($V_T$) in Region 3 have a memory cell electrical current ($I_{CELL}$) that charges corresponding integrating capacitors ($C_{INT}$) at a rate that generates sensing voltages on the integrating capacitors ($C_{INT}$) that do not exceed the trip voltage level of the sense amplifiers 112 until after the pulse count (N) 638 exceeds the second trigger count value $N_{T2}$ 1114 and before the pulse count (N) 638 reaches the third trigger count value $N_{T3}$ 1116.

Also based on the logical comparison operations associated with the soft bit extraction of FIG. 11B, the example programmed state detector 626 determines that bit locations having binary zeros '0' latched at the third trigger count value $N_{T3}$ 1116 and binary ones '1' latched at the fourth trigger count value $N_{T4}$ 1118 correspond to target memory cells with programmed threshold voltages ($V_T$) in Region 4 corresponding to binary region code '11'. For example, the target memory cells with programmed threshold voltages ($V_T$) in Region 4 have a memory cell electrical current ($I_{CELL}$) that charges corresponding integrating capacitors ($C_{INT}$) at a rate that generates sensing voltages on the integrating capacitors ($C_{INT}$) that do not exceed the trip voltage level of the sense amplifiers 112 until after the pulse count (N) 638 exceeds the third trigger count value $N_{T3}$ 1116 and before the pulse count (N) 638 reaches the fourth trigger count value $N_{T4}$ 1118.

Also based on the logical comparison operations associated with the soft bit extraction of FIG. 11B, the example programmed state detector 626 determines that bit locations having binary zeros '0' latched at the fourth trigger count value $N_{T4}$ 1118 correspond to target memory cells with programmed threshold voltages ($V_T$) in Region 5 corresponding to binary region code '10'. For example, the target memory cells with programmed threshold voltages ($V_T$) in Region 5 have a memory cell electrical current ($I_{CELL}$) that charges corresponding integrating capacitors ($C_{INT}$) at a rate that generates sensing voltages on the integrating capacitors ($C_{INT}$) that do not exceed the trip voltage level of the sense amplifiers 112 before the pulse count (N) 638 reaches the fourth trigger count value $N_{T4}$ 1118.

After the soft bit information is extracted and grouped into the different Regions 2-5, the output analyzer 628 (FIG. 6) can analyze the soft bit information to determine whether to redefine the boundary reference voltages (R0-R3 of FIG. 11A) of threshold voltage ($V_T$) ranges to re-align the threshold voltage ($V_T$) distribution of the flash memory 104 to more accurately represent information stored in the memory cells 104.

Figure 12:
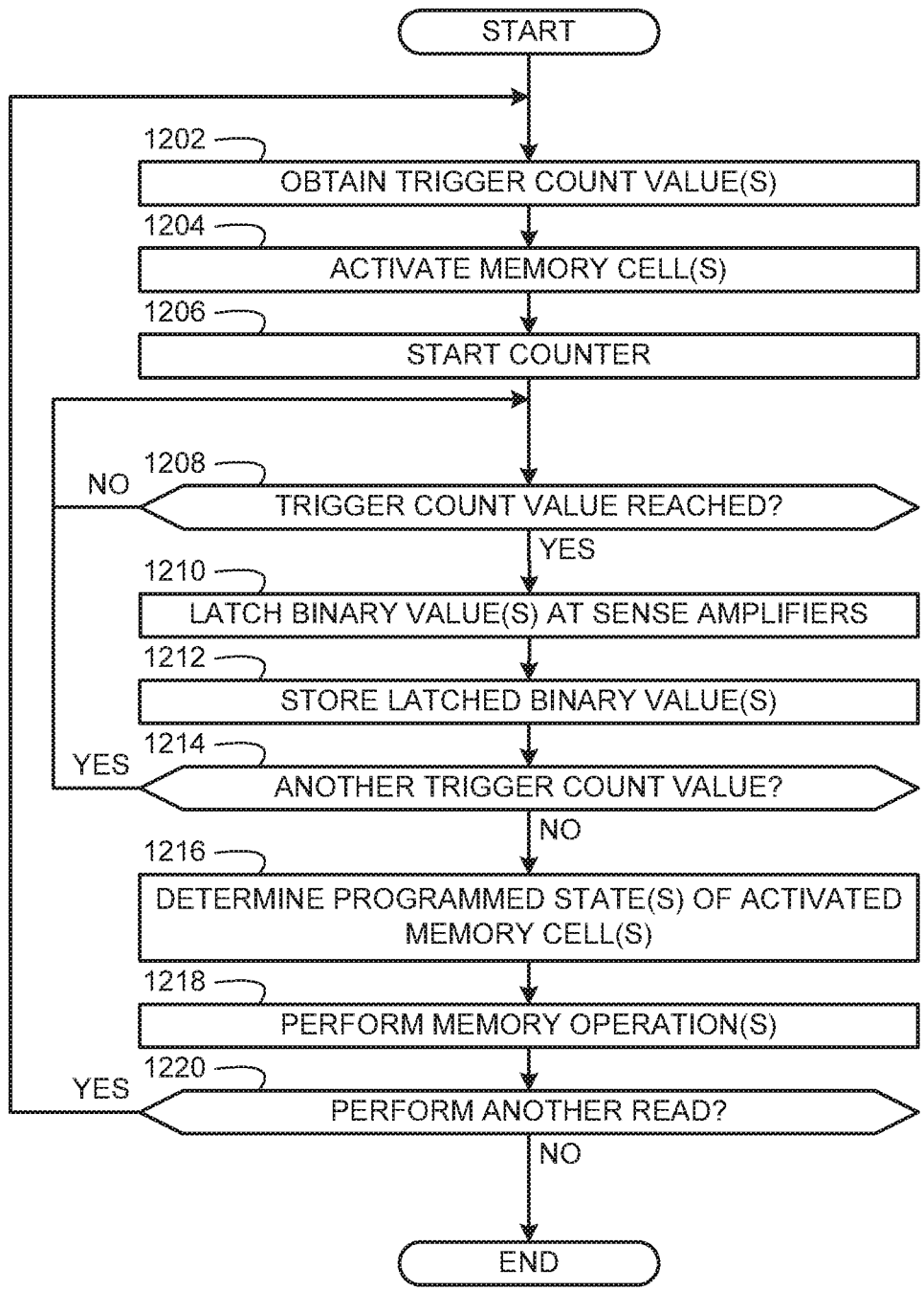
FIG. 12 is a flow diagram representative of example computer readable instructions that may be executed to implement the example memory controller of FIG. 1 and/or the example apparatus of FIG. 6 to use pulse count-based triggers to read programmed states of memory cells of the flash memory of FIG. 1.
Figure 13:
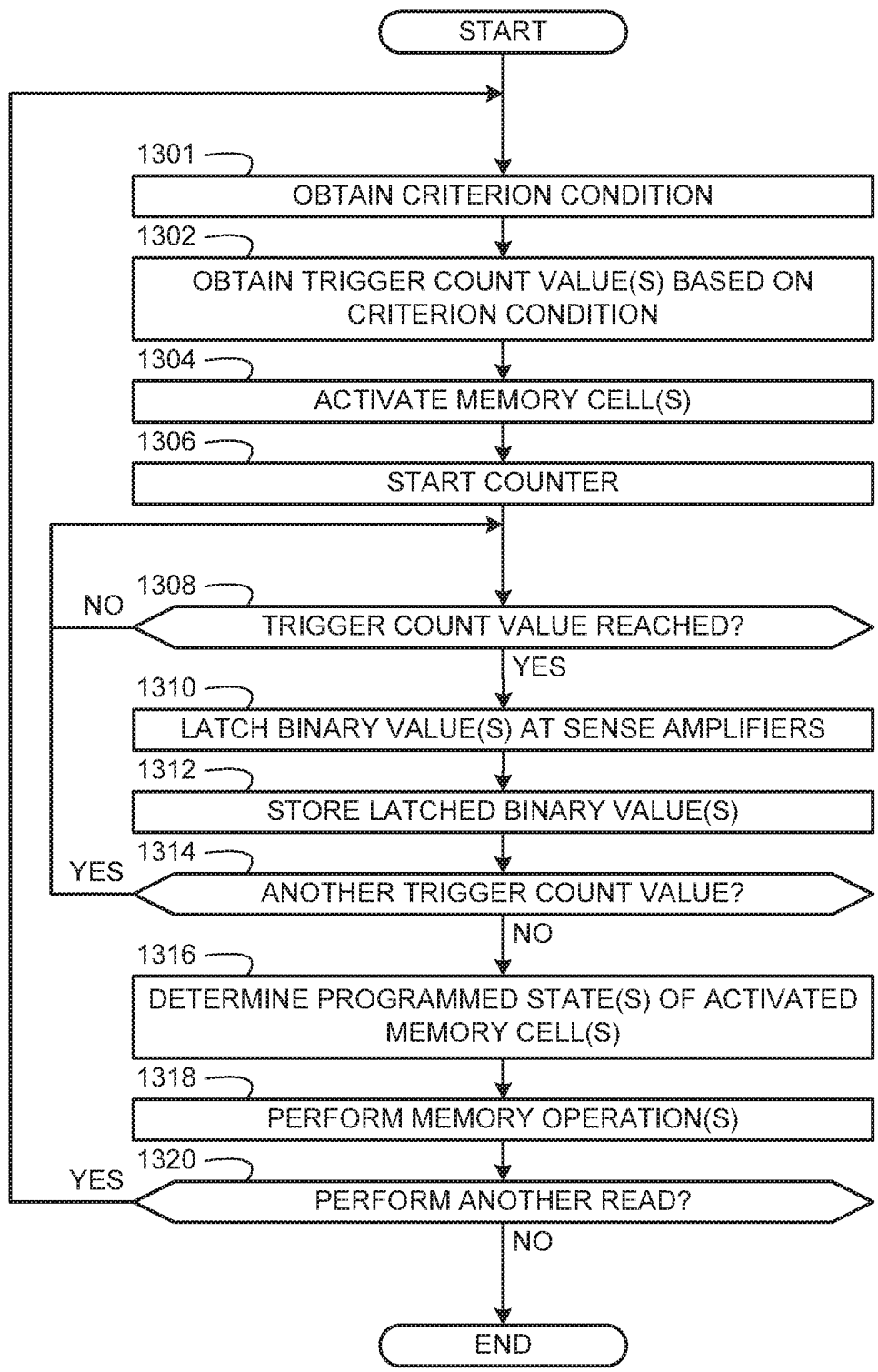
FIG. 13 is a flow diagram representative of example computer readable instructions that may be executed to implement the example memory controller of FIG. 1 and/or the example apparatus of FIG. 6 to use pulse count-based triggers based on different pulse count criteria to read programmed states of memory cells of the flash memory of FIG. 1.

FIGS. 12 and 13 illustrate flowcharts representative of example machine readable instructions for implementing the example apparatus 600 of FIG. 6 and/or the example memory controller 102 of FIG. 1 to sense programmed states of memory cells using pulse counts to trigger sense amplifiers (e.g., the sense amplifiers 112 of FIGS. 1 and 6). In these examples, the machine readable instructions include one or more programs for execution by a processor or controller such as the micro-controller 632 of FIG. 6 and/or the memory controller 102 of FIG. 1. The program(s) may be embodied in software stored on a tangible computer readable storage medium such as a CD-ROM, a floppy disk, a hard drive, a digital versatile disk (DVD), a Blu-ray disk, or a memory (e.g., the instruction memory 634 of FIG. 6) associated with the micro-controller 632, but the entirety of the program(s) and/or parts thereof could alternatively be executed by a device other than the micro-controller 632 and/or embodied in firmware or dedicated hardware. Further, although the example program(s) is/are described with reference to the flowcharts illustrated in FIGS. 12 and 13, many other methods of implementing the example apparatus 600 and/or the example memory controller 102 may alternatively be used. For example, the order of execution of the blocks may be changed, and/or some of the blocks described may be changed, eliminated, or combined.

As mentioned above, the example processes of FIGS. 12 and 13 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 12 and 13 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 12 is a flow diagram representative of example computer readable instructions that may be executed to implement the example memory controller of FIG. 1 and/or the example apparatus 600 of FIG. 6 to use pulse count-based triggers to read programmed states of the memory cells 106 of the flash memory 104 of FIG. 1. The example process of FIG. 12 may be used to read/sense programmed states of the memory cells 106 of the flash memory 104. For example, the programmed states may be read during read-verify processes between programming passes of the memory cells 106, may be read to extract soft bit information as described above in connection with FIGS. 11A and 11B, and/or may be read during a read operation in which a host processor (e.g., the processor 1412 of FIG. 14) requests data from the flash memory 104.

The example process of FIG. 12 begins at block 1202 at which the example trigger value retriever 620 (FIG. 6) retrieves one or more trigger count values ($N_{Tn}$) 642 (FIG. 6). For example, trigger count value(s) ($N_{Tn}$) 642 may correspond to reading different programmed states (e.g., the threshold voltages ($V_{Tn}$) 644) of the memory cells 106. In the illustrated example of block 1202, the trigger value retriever 620 accesses the one or more trigger count values ($N_{Tn}$) 642 in the trigger value store 618 (FIG. 6), and loads the one or more trigger count values ($N_{Tn}$) 642 in the one or more trigger register(s) 614 (FIG. 6).

The example voltage controller 622 (FIG. 6) activates one or more of the memory cells 106 (block 1204). For example, the voltage controller 622 activates the one or more memory cells 106 by applying the wordline verify-read voltage ($V_{WLRV}$) 214 (FIG. 2) to the corresponding wordline (e.g., the wordline (WL(0)) 108 of FIGS. 1 and 6) and the bitline precharge voltage ($V_{bl}$) 604 (FIG. 6) to one or more corresponding bitlines (e.g., one or more bitlines (BL(x)) 110 of FIGS. 1 and 6). In the illustrated example, the one or more memory cells 106 are activated to enable reading/sensing their programmed states (e.g., programmed threshold voltages ($V_T$)).

In the illustrated example, when the voltage controller 622 activates the one or more memory cells 106 at block 1204, the example micro-controller 632 (FIG. 6) starts the example counter 136 (FIGS. 1 and 6) at block 1206. For example, the micro-controller 632 enables the counter 136 to start incrementing/accumulating pulse counts based on an input clock signal (e.g., the clock signal 720 of FIG. 7 and/or 1126 of FIG. 11) from the example clock 636 (FIG. 6). In the illustrated example, the micro-controller 632 starts the counter 136 to start counting from zero at the same time or substantially the same time (e.g., within one and 10 clock periods ($T_{clk}$) of the clock signal from the clock 636) as the voltage controller 622 activates the one or more memory cells 106. In other examples, other suitable delay between the starting of the counter 136 and the activating of the one or more cells 106 may be used as long as count trigger values ($N_{Tn}$) 642 used to latch binary values from the sense amplifiers 112 sufficiently correspond to amounts of elapsed time during which memory cell electrical currents ($I_{CELL}$) build charges on integrating capacitors (e.g., the integrating capacitor ($C_{INT}$) 602 of FIG. 6).

The example comparator 616 determines whether a trigger count value ($N_{Tn}$) 642 in the trigger register 614 has been reached (block 1208). For example, the comparator 616 compares the pulse count (N) 638 from the counter 136 to the trigger count value ($N_{Tn}$) 642 in the trigger register 614. If the trigger count value ($N_{Tn}$) 642 has not been reached, the comparator 616 continues to compare the pulse count (N) 638 to the trigger count value ($N_{Tn}$) 642. When the comparator 616 detects a match at block 1208 between the pulse count (N) 638 and the trigger count value ($N_{Tn}$) 642, one or more binary value(s) is/are latched at the sense amplifiers 112 (block 1210). For example, the comparator 616 outputs a trigger (SENB) signal 644 (FIG. 6) to assert the strobe (STB) line of the sense amplifiers 112. In this manner, the sense amplifiers 112 are triggered to latch one or more binary zeros or ones at one or more bit location(s) corresponding to the one or more activated memory cell(s) 106. For example, the latched binary zero or one per memory cell 106 is indicative of whether the memory cell 106 has a memory cell electrical current ($I_{CELL}$) to sufficiently develop a charge on a corresponding integrating capacitor ($C_{INT}$) (e.g., the integrating capacitor ($C_{INT}$) 602 of FIG. 6) to exceed a trip voltage level of the sense amplifiers 112.

The latched binary value(s) from the sense amplifiers 112 is/are stored in a data cache (block 1212). For example, one of the data caches 114, 116, 118 (FIGS. 1 and 6) may store the latched binary value(s). The example micro-controller 632 then determines whether to continue monitoring the pulse count (N) 638 from the counter 136 based on another trigger count value ($N_{Tn}$) 642 (block 1214). If the micro-controller 632 determines at block 1214 to continue monitoring the pulse count (N) 638 based on another trigger count value ($N_{Tn}$) 642, control returns to block 1208. Otherwise, if the micro-controller 632 determines that there is not another trigger count value ($N_{Tn}$) 642, control advances to block 1216.

At block 1216, the example programmed state detector 626 (FIG. 6) determines programmed states of the one or more activated memory cells 106. For example, the programmed state detector 626 can determine the programmed state(s) (e.g., programmed threshold voltages ($V_T$)) of the one or more activated memory cell(s) 106 by using one or more logical comparison operations to analyze the latched binary value(s) stored in one or more of the data caches 114, 116, 118.

At block 1218, the apparatus 600 then performs one or more memory operation(s) based on the programmed states determined at block 1216. For example, if the process of FIG. 12 is being performed during a program-verify operation, the output analyzer 628 may determine whether a further programming pass is needed to program the one or more activated memory cell(s) 106 to a target threshold voltage ($V_{TT}$). If further programming pass is needed, the output analyzer 628 may also determine program pulse-type(s) needed to reach the target threshold voltage ($V_{TT}$) for the one or more activated memory cell(s) 106 as described above in connection with FIG. 7C. If the process of FIG. 12 is being performed to service a read request from a host processor connected to the flash memory 104, a memory operation at block 1218 may involve the I/O buffer interface to write data represented by the programmed memory states to a data bus of the flash memory 104 for access by the requesting host processor.

If the process of FIG. 12 is being performed to extract and analyze soft bit information as described above in connection with FIGS. 11A and 11B, the memory operations of block 1218 may involve the programmed state detector 626 associating memory cells 106 with different ones of the Regions 2-5 in the soft bit range as described above in connection with FIGS. 11A and 11B. In addition, the output analyzer 628 (FIG. 6) may analyze the distribution of the memory cells 106 over the Regions 2-5 to determine whether to redefine the boundary reference voltages (R0-R3 of FIG. 11A) of threshold voltage ($V_T$) ranges to re-align the threshold voltage ($V_T$) distribution of the flash memory 104 to more accurately represent information stored in the memory cells 104. In such examples, the results of the output analyzer 628 can then be used by the micro-controller 632 to redefine the boundary reference voltages (R0-R3 of FIG. 11A) of threshold voltage ($V_T$) ranges.

After performing the one or more memory operation(s) at block 1218, the micro-controller 632 determines whether to perform another read (block 1220). If the apparatus 600 is to perform another read, control returns to block 1202. Otherwise, the example process of FIG. 12 ends.

FIG. 13 is a flow diagram representative of example computer readable instructions that may be executed to implement the example memory controller 102 of FIG. 1 and/or the example apparatus 600 of FIG. 6 to use pulse count-based triggers to read programmed states of memory cells 106 of the flash memory 104 of FIG. 1 based on different pulse count criteria. Example criteria may be temperature of a memory cell array of the flash memory 104, locations of memory cells 106 within a memory cell array of the flash memory 104, and/or values of threshold voltages ($V_T$) intended to be read from programmed memory cells 106. The example process of FIG. 13 may be used to read/sense programmed states of the memory cells 106 of the flash memory 104 using trigger count values ($N_{Tn}$) 642 (FIG. 6) selected based on one or more example criteria. For example, the programmed states may be read during read-verify processes between programming passes of the memory cells 106, may be read to extract soft bit information as described above in connection with FIGS. 11A and 11B, and/or may be read during a read operation in which a host processor (e.g., the processor 1412 of FIG. 14) requests data from the flash memory 104.

The example process of FIG. 13 begins at block 1301 at which the example criterion condition detector 624 obtains one or more criterion conditions of one or more memory cells 106 to be read. For example, the criterion condition detector 624 may measure a temperature (e.g., using an in-die or on-board thermocouple) of a memory cell array in which the one or more memory cells 106 are located. The criterion condition detector 624 may detect a memory array location of a row (e.g., a wordline) of the one or more memory cells 106 of the flash memory 104 (e.g., using a wordline address decoder). The criterion condition detector 624 may obtain threshold voltage ($V_T$) levels intended to be read from the one or more memory cells 106. As such, the one or more criterion conditions obtained by the criterion condition detector 624 can be used by the apparatus 600 to read programmed states of the one or more memory cells 106 as described above in connection with FIGS. 8, 9, 10A, and 10B.

At block 1302 the example trigger value retriever 620 (FIG. 6) retrieves one or more trigger count values ($N_{Tn}$) 642 (FIG. 6) based on the criterion condition. For example, the trigger value retriever 620 retrieves the one or more trigger count values ($N_{Tn}$) 642 in the trigger value store 618 (FIG. 6) based on the criterion condition, and loads the one or more trigger count values ($N_{Tn}$) 642 in the one or more trigger register(s) 614 (FIG. 6).

The example voltage controller 622 (FIG. 6) activates one or more of the memory cells 106 (block 1304). For example, the voltage controller 622 activates the one or more memory cells 106 by applying the wordline verify-read voltage ($V_{WLRV}$) 214 (FIG. 2) to the corresponding wordline (e.g., the wordline (WL(0)) 108 of FIGS. 1 and 6) and the bitline precharge voltage ($V_{bl}$) 604 (FIG. 6) to one or more corresponding bitlines (e.g., one or more bitlines (BL(x)) 110 of FIGS. 1 and 6). In the illustrated example, the one or more memory cells 106 are activated to enable reading/sensing their programmed states (e.g., programmed threshold voltages ($V_T$)).

In the illustrated example, when the voltage controller 622 activates the one or more memory cells 106 at block 1304, the example micro-controller 632 (FIG. 6) starts the example counter 136 (FIGS. 1 and 6) at block 1306. For example, the micro-controller 632 enables the counter 136 to start incrementing/accumulating pulse counts based on an input clock signal (e.g., the clock signal 720 of FIG. 7 and/or 1126 of FIG. 11) from the example clock 636 (FIG. 6). In the illustrated example, the micro-controller 632 starts the counter 136 to start counting from zero at the same time or substantially the same time (e.g., within one and 10 clock periods ($T_{clk}$) of the clock signal from the clock 636) as the voltage controller 622 activates the one or more memory cells 106. In other examples, other suitable delay between the starting of the counter 136 and the activating of the one or more cells 106 may be used as long as count trigger values ($N_{Tn}$) 642 used to latch binary values from the sense amplifiers 112 sufficiently correspond to amounts of elapsed time during which memory cell electrical currents ($I_{CELL}$) build charges on integrating capacitors (e.g., the integrating capacitor ($C_{INT}$) 602 of FIG. 6).

The example comparator 616 determines whether a trigger count value ($N_{Tn}$) 642 in the trigger register 614 has been reached (block 1308). For example, the comparator 616 compares the pulse count (N) 638 from the counter 136 to the trigger count value ($N_{Tn}$) 642 in the trigger register 614. If the trigger count value ($N_{Tn}$) 642 has not been reached, the comparator 616 continues to compare the pulse count (N) 638 to the trigger count value ($N_{Tn}$) 642. When the comparator 616 detects a match at block 1308 between the pulse count (N) 638 and the trigger count value ($N_{Tn}$) 642, one or more binary value(s) is/are latched at the sense amplifiers 112 (block 1310). For example, the comparator 616 outputs a trigger (SENB) signal 644 (FIG. 6) to assert the strobe (STB) line of the sense amplifiers 112. In this manner, the sense amplifiers 112 are triggered to latch one or more binary zeros or ones at one or more bit location(s) corresponding to the one or more activated memory cell(s) 106. For example, the latched binary zero or one per memory cell 106 is indicative of whether the memory cell 106 has a memory cell electrical current ($I_{CELL}$) to sufficiently develop a charge on a corresponding integrating capacitor ($C_{INT}$) (e.g., the integrating capacitor ($C_{INT}$) 602 of FIG. 6) to exceed a trip voltage level of the sense amplifiers 112.

The latched binary value(s) from the sense amplifiers 112 is/are stored in a data cache (block 1312). For example, one of the data caches 114, 116, 118 (FIGS. 1 and 6) may store the latched binary value(s). The example micro-controller 632 then determines whether to continue monitoring the pulse count (N) 638 from the counter 136 based on another trigger count value ($N_{Tn}$) 642 (block 1314). If the micro-controller 632 determines at block 1314 to continue monitoring the pulse count (N) 638 based on another trigger count value ($N_{Tn}$) 642, control returns to block 1308. Otherwise, if the micro-controller 632 determines that there is not another trigger count value ($N_{Tn}$) 642, control advances to block 1316.

At block 1316, the example programmed state detector 626 (FIG. 6) determines programmed states of the one or more activated memory cells 106. For example, the programmed state detector 626 can determine the programmed state(s) (e.g., programmed threshold voltages ($V_T$)) of the one or more activated memory cell(s) 106 by using one or more logical comparison operations to analyze the latched binary value(s) stored in one or more of the data caches 114, 116, 118.

At block 1318, the apparatus 600 then performs one or more memory operation(s) based on the programmed states determined at block 1316. For example, if the process of FIG. 13 is being performed during a program-verify operation, the output analyzer 628 may determine whether a further programming pass is needed to program the one or more activated memory cell(s) 106 to a target threshold voltage ($V_{TT}$). If further programming pass is needed, the output analyzer 628 may also determine program pulse-type(s) needed to reach the target threshold voltage ($V_{TT}$) for the one or more activated memory cell(s) 106 as described above in connection with FIG. 7C. If the process of FIG. 13 is being performed to service a read request from a host processor connected to the flash memory 104, a memory operation at block 1318 may involve the I/O buffer interface to write data represented by the programmed memory states to a data bus of the flash memory 104 for access by the requesting host processor.

If the process of FIG. 13 is being performed to extract and analyze soft bit information as described above in connection with FIGS. 11A and 11B, the memory operations of block 1318 may involve the programmed state detector 626 associating memory cells 106 with different ones of the Regions 2-5 in the soft bit range as described above in connection with FIGS. 11A and 11B. In addition, the output analyzer 628 (FIG. 6) may analyze the distribution of the memory cells 106 over the Regions 2-5 to determine whether to redefine the boundary reference voltages (R0-R3 of FIG. 11A) of threshold voltage ($V_T$) ranges to re-align the threshold voltage ($V_T$) distribution of the flash memory 104 to more accurately represent information stored in the memory cells 104. In such examples, the results of the output analyzer 628 can then be used by the micro-controller 632 to redefine the boundary reference voltages (R0-R3 of FIG. 11A) of threshold voltage ($V_T$) ranges.

After performing the one or more memory operation(s) at block 1318, the micro-controller 632 determines whether to perform another read (block 1320). If the apparatus 600 is to perform another read, control returns to block 1301. Otherwise, the example process of FIG. 13 ends.

Figure 14:
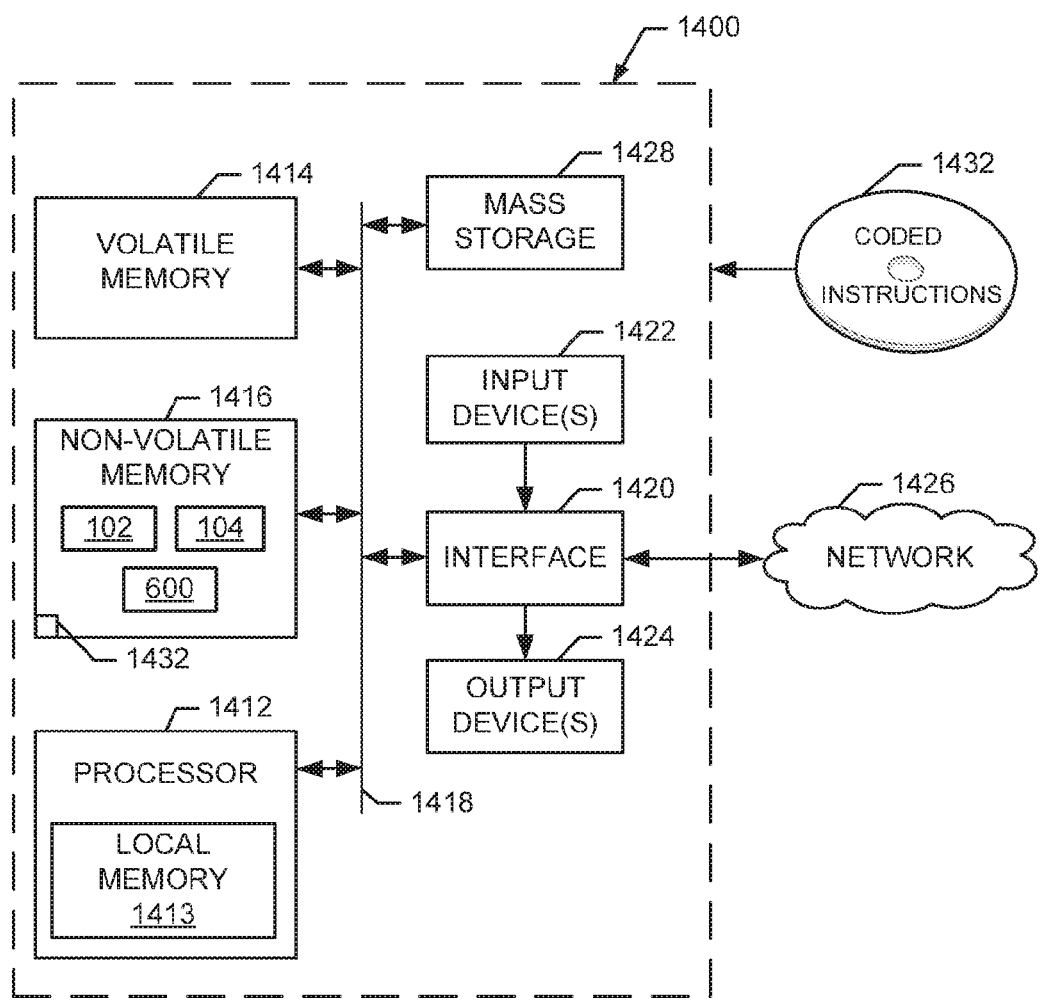
FIG. 14 is an example processor platform capable of executing the example computer readable instructions represented by FIGS. 12 and 13 to implement the example memory controller of FIG. 1 and/or the example apparatus of FIG. 6 to use pulse count-based triggers to read programmed states of memory cells of the flash memory of FIG. 1 in accordance with the teachings of this disclosure.

FIG. 14 is a block diagram of an example processor platform 1400 capable of executing the instructions of FIGS. 12 and/or 13 to implement the example memory controller 102 of FIG. 1 and/or the example apparatus 600 of FIG. 6. The processor platform 1400 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 1400 of the illustrated example includes a processor 1412. The processor 1412 of the illustrated example is hardware. For example, the processor 1412 can be implemented by one or more integrated circuits, logic circuits, microprocessors or controllers from any desired family or manufacturer.

The processor 1412 of the illustrated example includes a local memory 1413 (e.g., a cache). The processor 1412 of the illustrated example is in communication with a main memory including a volatile memory 1414 and a non-volatile memory 1416 via a bus 1418. The volatile memory 1414 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1416 may be implemented by flash memory and/or any other desired type of memory device. Access to the main memory 1414, 1416 is controlled by one or more memory controllers. In the illustrated example of FIG. 14, the memory controller 102, the flash memory 104, and the apparatus 600 are shown as being implemented in the non-volatile memory 1416. Additionally or alternatively, the memory controller 102, the flash memory 104, and the apparatus 600 may be implemented in the volatile memory 1414. In other examples, the memory controller 102 and/or the apparatus 600 may be implemented separate from the non-volatile memory 1416 (and/or the volatile memory 1414) and communicatively coupled with the non-volatile memory 1416 to control the flash memory 104 (and/or communicatively coupled to the volatile memory 1414 to control the volatile memory 1414).

The processor platform 1400 of the illustrated example also includes an interface circuit 1420. The interface circuit 1420 may be implemented by any type of interface standard, such as an Ethernet interface, a universal serial bus (USB), and/or a PCI express interface.

In the illustrated example, one or more input devices 1422 are connected to the interface circuit 1420. The input device(s) 1422 permit(s) a user to enter data and commands into the processor 1412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1424 are also connected to the interface circuit 1420 of the illustrated example. The output devices 1424 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1420 of the illustrated example, thus, typically includes a graphics driver card, a graphics driver chip or a graphics driver processor.

The interface circuit 1420 of the illustrated example also includes a communication device such as a transmitter, a receiver, a transceiver, a modem and/or network interface card to facilitate exchange of data with external machines (e.g., computing devices of any kind) via a network 1426 (e.g., an Ethernet connection, a digital subscriber line (DSL), a telephone line, coaxial cable, a cellular telephone system, etc.).

The processor platform 1400 of the illustrated example also includes one or more mass storage devices 1428 for storing software and/or data. Examples of such mass storage devices 1428 include floppy disk drives, hard drive disks, compact disk drives, Blu-ray disk drives, RAID systems, and digital versatile disk (DVD) drives.

Coded instructions 1432 for use by the memory controller 102 and/or the apparatus 600 to implement the example processes of FIG. 12 and/or FIG. 13 may be stored in the non-volatile memory 1416, and/or on a removable tangible computer readable storage medium such as a CD or DVD.

Examples disclosed herein are useful to determine programmed states of memory cells in semiconductor memory devices based on tracking elapsed durations (e.g., using clock pulse counts) to trigger sense amplifiers to sense programmed states of memory cells. Although duration-based sense amplifier triggering is disclosed herein in connection with some examples, such duration-based sense amplifier triggering may be implemented in connection with other example implementations. For example, duration-based sense amplifier triggering may be used in accordance with the teachings of this disclosure in connection with memory characteristics that affect memory cell electrical current ($I_{CELL}$) through a memory cell transistor in addition to or instead of memory cell temperature coefficient (e.g., as described in connection with FIGS. 8 and 9) and memory cell location in a memory cell array (e.g., as described in connection with FIGS. 10A and 10B). Another example memory characteristic that may be used to select different duration-based triggers (e.g., the trigger count values 138, 140, 142 of FIG. 1 and 642 of FIG. 6) for triggering sense amplifiers includes changes in memory array current. For example, electrical current flowing through a memory array of memory cells is affected by different data patterns stored in memory cells of the memory array. As such, different suitable duration-based triggers may be selected based on the example memory characteristic of changes in memory array currents based on different stored data patterns. Yet another example memory characteristic that may be used to select different duration-based triggers (e.g., the trigger count values 138, 140, 142 of FIG. 1 and 642 of FIG. 6) for triggering sense amplifiers includes changes in memory array tile source voltages. For example, electrical current flowing through a memory array of memory cells is affected by changes in voltage bias on a source plate of a memory. As such, different suitable duration-based triggers may be selected based on the example memory characteristic of changes in voltage bias on a source plate of a memory.

Examples disclosed herein are useful to improve the speeds of reading programmed states of memory cells. For example, because examples disclosed herein trigger sense amplifiers based on clock pulse counts, a wordline voltage of activated memory cells can remain fixed while sensing a threshold voltage ($V_T$) distribution of the memory cells. Keeping such wordline voltages fixed increases the speeds with which programmed states of memory cells can be read because keeping the wordline voltage fixed decreases a wordline settling time to near a resistance-capacitance (RC) delay of the wordline for each discrete read/verify threshold voltage ($V_T$) level. For example, each time a different voltage is applied to a wordline to sense a different threshold voltage ($V_T$) using prior memory cell sensing techniques, additional time is required to settle the wordline to a steady-state at which memory cells on that wordline can be sensed. By applying only a single fixed voltage to the wordline to sense a threshold voltages ($V_T$) distribution using clock pulse counts as disclosed herein, numerous lengthy settling times of prior techniques are eliminated so that numerous threshold voltages ($V_T$) can be sensed much quicker.

Examples disclosed herein are useful to improve the accuracies of reading programmed states of memory cells. For example, a sense time ($t_{sen}$) of a sense amplifier can be changed by selecting different pulse counts (N) at which to trigger the sense amplifier and/or by selecting different clock periods ($T_{clk}$) used to drive a counter that generates the pulse counts (N). For example, the clock period ($T_{clk}$) can be decreased to achieve higher resolution readings of memory cell programmed states. In addition, accuracy can be further increased by using second or third order linear relationships between pulse counts (N) and memory cell electrical current ($I_{CELL}$) for different voltage separations between gate-to-source voltage ($V_{gs}$) and threshold voltage ($V_T$) (e.g., $V_{gs}-V_T$).

The following pertain to further examples disclosed herein.

Example 1 is a method to sense programmed states of memory cells. The method of Example 1 includes starting a counter at a time of activating a plurality of memory cells; obtaining binary values based on sense amplifiers in circuit with the memory cells in response to the counter reaching a trigger count value; and based on the binary values, determining a programmed state of the memory cells.

In Example 2, the subject matter of Example 1 can optionally include that the counter reaching the trigger count value causes the sense amplifiers to latch the binary values.

In Example 3, the subject matter of any one of Examples 1-2 can optionally include selecting the trigger count value from a plurality of different trigger count values based on a measured characteristic of the memory cells.

In Example 4, the subject matter of any one of Examples 1-3 can optionally include that the programmed state of the memory cells is a programmed threshold voltage.

In Example 5, the subject matter of any one of Examples 1-4 can optionally include that the trigger count value corresponds to an amount of memory cell electrical current flow between drain terminals and source terminals of transistors of the memory cells when the memory cells are activated.

In Example 6, the subject matter of any one of Examples 1-5 can optionally include obtaining the trigger count value based on a temperature of the memory cells.

In Example 7, the subject matter of any one of Examples 1-6 can optionally include obtaining the trigger count value based on a location of the memory cells in a memory cell array.

In Example 8, the subject matter of any one of Examples 1-7 can optionally include obtaining the trigger count value based on a target threshold voltage and a temperature of the memory cells.

In Example 9, the subject matter of any one of Examples 1-8 can optionally include that the trigger count value is obtained based on a first temperature coefficient of the memory cells, the first temperature coefficient corresponding to the programmed state to be measured, the first temperature coefficient being different from a second temperature coefficient of the memory cells when the memory cells are programmed to a second programmed state, and the second temperature coefficient corresponding to a second trigger count value to determine when the memory cells are programmed to the second programmed state.

In Example 10, the subject matter of any one of Examples 1-9 can optionally include that activating the memory cells includes applying voltages to bitlines and a wordline corresponding to the memory cells.

In Example 11, the subject matter of any one of Examples 1-10 can optionally include that starting the counter includes enabling the counter to start accumulating count values based on an input clock signal.

Example 12 is an apparatus to sense a programmed state of a memory cell. The apparatus of Example 12 includes a counter to start generating count values in response to activation of a memory cell. The apparatus of Example 12 also includes a sense amplifier in circuit with the memory cell to obtain a binary value corresponding to a programmed state of the memory cell in response to the counter reaching a trigger count value. The apparatus of Example 12 also includes a programmed state detector to determine the programmed state of the memory cell based on the binary value obtained by the sense amplifier.

In Example 13, the subject matter of Example 12 can optionally include a comparator to trigger the sense amplifier to latch the binary value in response to the counter reaching the trigger count value.

In Example 14, the subject matter of any one of Examples 12-13 can optionally include a trigger value retriever to obtain the trigger count value from a plurality of different trigger count values based on a measured characteristic of the memory cells.

In Example 15, the subject matter of any one of Examples 12-14 can optionally include that the programmed state of the memory cell is a programmed threshold voltage.

In Example 16, the subject matter of any one of Examples 12-15 can optionally include that the trigger count value corresponds to a memory cell electrical current that flows between a drain terminal and a source terminal of the transistor of the memory cell when the memory cell is activated.

In Example 17, the subject matter of any one of Examples 12-14 can optionally include that the trigger count value is less than a second retrievable trigger count value, a first memory cell electrical current corresponding to the trigger count value being more than a second memory cell electrical current corresponding to the second retrievable trigger count value, and the programmed state corresponding to the trigger count value being less than a second programmed state corresponding to the second retrievable trigger count value.

In Example 18, the subject matter of any one of Examples 12-17 can optionally include a trigger value retriever to obtain the trigger count value based on a first temperature coefficient of the memory cells, the first temperature coefficient corresponding to the programmed state to be measured, the first temperature coefficient being different from a second temperature coefficient of the memory cells when the memory cells are programmed to a second programmed state, and the second temperature coefficient corresponding to a second trigger count value to determine when the memory cells are programmed to the second programmed state.

In Example 19, the subject matter of any one of Examples 12-18 can optionally include a characteristic detector to obtain a temperature of a memory cell array in which the memory cell is located; and a trigger value retriever to obtain the trigger count value based on the temperature of the memory cell array.

In Example 20, the subject matter of any one of Examples 12-19 can optionally include a characteristic detector to obtain a location of the memory cell in a memory cell array; and a trigger value retriever to obtain the trigger count value based on the location of the memory cell in the memory cell array.

In Example 21, the subject matter of any one of Examples 12-20 can optionally include a characteristic detector to obtain a temperature for the memory cell; and a trigger value retriever to obtain the trigger count value based on the temperature and a target threshold voltage.

In Example 22, the subject matter of any one of Examples 12-21 can optionally include a voltage controller to activate the memory cell by applying voltages to a bitline and a wordline corresponding to the memory cell.

In Example 23, the subject matter of any one of Examples 12-22 can optionally include one or more processors; a network interface in communication with the one or more processors; and a memory controller in communication with the one or more processors, the memory controller including the duration tracker, the sense amplifier, and the programmed state detector.

Example 24 is at least one article of manufacture including machine readable instructions that, when executed, cause a memory controller to at least start a counter at a time of activating a plurality of memory cells; obtain binary values based on sense amplifiers in circuit with the memory cells in response to the counter reaching a trigger count value; and based on the binary values, determine a programmed state of the memory cells.

In Example 25, the subject matter of Example 24 can optionally include that the binary values are latched by the sense amplifiers in response to the counter reaching the trigger count value.

In Example 26, the subject matter of any one of Examples 24-25 can optionally include that the instructions are further to cause the memory controller to select the trigger count value from a plurality of different trigger count values based on a measured characteristic of the memory cells.

In Example 27, the subject matter of any one of Examples 24-26 can optionally include that the programmed state of the memory cells is a programmed threshold voltage.

In Example 28, the subject matter of any one of Examples 24-27 can optionally include that the trigger count value corresponds to an amount of memory cell electrical current flow between drain terminals and source terminals of transistors of the memory cells when the memory cells are activated.

In Example 29, the subject matter of any one of Examples 24-28 can optionally include that the instructions are further to cause the memory controller to obtain the trigger count value based on a temperature of the memory cells.

In Example 30, the subject matter of any one of Examples 24-29 can optionally include that the instructions are further to cause the memory controller to obtain the trigger count value based on a location of the memory cells in a memory cell array.

In Example 31, the subject matter of any one of Examples 24-30 can optionally include that the instructions are further to cause the memory controller to obtain the trigger count value based on a target threshold voltage and a temperature of the memory cells.

In Example 32, the subject matter of any one of Examples 24-31 can optionally include that the trigger count value is obtained based on a first temperature coefficient of the memory cells, the first temperature coefficient corresponding to the programmed state to be measured, the first temperature coefficient being different from a second temperature coefficient of the memory cells when the memory cells are programmed to a second programmed state, and the second temperature coefficient corresponding to a second trigger count value to determine when the memory cells are programmed to the second programmed state.

In Example 33, the subject matter of any one of Examples 24-32 can optionally include that the instructions are to cause the memory controller to activate the memory cells by applying voltages to bitlines and a wordline corresponding to the memory cells.

In Example 34, the subject matter of any one of Examples 24-33 can optionally include that starting the counter includes enabling the counter to start accumulating count values based on an input clock signal.

Example 35 is an apparatus to sense a programmed state of a memory cell. The apparatus of Example 35 includes means for accumulating a count value in response to activation of a memory cell. The apparatus of Example 35 also includes means for obtaining a binary value corresponding to a programmed state of the memory cell in response to the count value satisfying a trigger count value. The apparatus of Example 35 also includes means for determining the programmed state of the memory cell based on the binary value.

In Example 36, the subject matter of Example 35 can optionally include that the means for obtaining the binary value is triggered to latch the binary value by a means for comparing a counter value of the counter to the trigger count value.

In Example 37, the subject matter of any one of Examples 35-36 can optionally include means for obtaining the trigger count value from a plurality of different trigger count values based on a measured characteristic of the memory cells.

In Example 38, the subject matter of any one of Examples 35-37 can optionally include that the programmed state of the memory cell is a programmed threshold voltage.

In Example 39, the subject matter of any one of Examples 35-38 can optionally include that the trigger count value corresponds to a memory cell electrical current that flows between a drain terminal and a source terminal of the transistor of the memory cell when the memory cell is activated.

In Example 40, the subject matter of any one of Examples 35-39 can optionally include that the trigger count value is less than a second retrievable trigger count value, a first memory cell electrical current corresponding to the trigger count value being more than a second memory cell electrical current corresponding to the second retrievable trigger count value, and the programmed state corresponding to the trigger count value being less than a second programmed state corresponding to the second retrievable trigger count value.

In Example 41, the subject matter of any one of Examples 35-40 can optionally include means for obtaining the trigger count value based on a first temperature coefficient of the memory cells, the first temperature coefficient corresponding to the programmed state to be measured, the first temperature coefficient being different from a second temperature coefficient of the memory cells when the memory cells are programmed to a second programmed state, and the second temperature coefficient corresponding to a second trigger count value to determine when the memory cells are programmed to the second programmed state.

In Example 42, the subject matter of any one of Examples 35-41 can optionally include means for obtaining a temperature of a memory cell array in which the memory cell is located; and means for obtaining the trigger count value based on the temperature of the memory cell array.

In Example 43, the subject matter of any one of Examples 35-42 can optionally include means for obtaining a location of the memory cell in a memory cell array; and means for obtaining the trigger count value based on the location of the memory cell in the memory cell array.

In Example 44, the subject matter of any one of Examples 35-43 can optionally include means for obtaining a temperature for the memory cell; and means for obtaining the trigger count value based on the temperature and a target threshold voltage.

In Example 45, the subject matter of any one of Examples 35-44 can optionally include means for activating the memory cell by applying voltages to a bitline and a wordline corresponding to the memory cell.

In Example 46, the subject matter of any one of Examples 35-45 can optionally include one or more processors; a network interface in communication with the one or more processors; and a memory controller in communication with the one or more processors, the memory controller including the means for accumulating the count value, the means for obtaining the binary value, and the means for determining the programmed state of the memory cell.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method to program memory cells, comprising:
   determining programmed states of a plurality of memory cells based on a counter reaching a trigger count value, the trigger count value selected from a plurality of different trigger count values based on a characteristic of the memory cells;
   determining, based on the programmed states, first ones of the memory cells that do not satisfy a target threshold voltage; and
   performing a programming pass on the first ones of the memory cells.

2. A method of claim 1, further including determining a program pulse-type for use with the performing of the programming pass on the first ones of the memory cells, the program pulse-type determined based on analyzing the programmed states of the first ones of the memory cells relative to the target threshold voltage.

3. A method of claim 2, wherein the program pulse-type is selected to be a full program pulse or a partial program pulse.

4. A method of claim 1, further including:
   determining, based on the programmed states, second ones of the memory cells that satisfy the target threshold voltage; and
   inhibiting the second ones of the memory cells from the programming pass based on ones of the programmed states corresponding to the second ones of the memory cells satisfying the target threshold voltage.

5. A method of claim 1, further including starting the counter in association with activating the plurality of memory cells.

6. A method of claim 1, wherein the memory cells store multiple bits per memory cell.

7. A method of claim 1, wherein the target threshold voltage is representative of data to be stored in the memory cells.

8. A method of claim 1, wherein the memory cells are NAND flash memory.

9. An apparatus to program memory cells, comprising:
   a programmed state detector to determine programmed states of a plurality of memory cells based on a counter reaching a trigger count value, the trigger count value selected from a plurality of different trigger count values based on a characteristic of the memory cells;
   an analyzer to determine, based on the programmed states, first ones of the memory cells that do not satisfy a target threshold voltage; and
   a circuit to perform a programming pass on the first ones of the memory cells.

10. An apparatus of claim 9, wherein the analyzer is further to determine a program pulse-type for use with the performing of the programming pass on the first ones of the memory cells, the program pulse-type determined based on analyzing the programmed states of the first ones of the memory cells relative to the target threshold voltage.

11. An apparatus of claim 10, wherein the analyzer is to select the program pulse-type to be a full program pulse or a partial program pulse.

12. An apparatus of claim 9, wherein the analyzer is further to:
   determine, based on the programmed states, second ones of the memory cells that satisfy the target threshold voltage; and
   determine to inhibit the second ones of the memory cells from the programming pass based on ones of the programmed states corresponding to the second ones of the memory cells satisfying the target threshold voltage.

13. An apparatus of claim 9, wherein the counter is to reach the trigger count value after starting in association with activating the plurality of memory cells.

14. An apparatus of claim 9, wherein the memory cells store multiple bits per memory cell.

15. An apparatus of claim 9, wherein the target threshold voltage is representative of data to be stored in the memory cells.

16. An apparatus of claim 9, wherein the memory cells are NAND flash memory.

17. At least one article of manufacture comprising machine readable instructions that, when executed, cause a memory controller to at least:
determine programmed states of a plurality of memory cells based on a counter reaching a trigger count value;
associate ones of the memory cells with different regions of a soft bit range based on the programmed states; and
redefine boundary reference voltages of threshold voltage ranges corresponding to the memory cells based on a distribution of the ones of the memory cells across the regions of the soft bit range.

18. At least one article of manufacture of claim 17, wherein the instructions are further to cause the memory controller to select the trigger count value from a plurality of different trigger count values based on a characteristic of the memory cells.

19. At least one article of manufacture of claim 17, wherein the soft bit range is between first and second boundary reference voltages, the first boundary reference voltage to represent a first binary value, and the second boundary reference voltage to represent a second binary value.

20. At least one article of manufacture of claim 19, wherein the redefining of the boundary reference voltages of the threshold voltage ranges aligns the ones of the memory cells with representing the first binary value or the second binary value.

21. At least one article of manufacture of claim 17, wherein the instructions are further to cause the memory controller to start the counter in association with activating the plurality of memory cells.

22. At least one article of manufacture of claim 17, wherein the memory cells store multiple bits per memory cell.

23. At least one article of manufacture of claim 17, wherein the memory cells are NAND flash memory.

24. At least one article of manufacture comprising machine readable instructions that, when executed, cause a memory controller to at least:
determine programmed states of a plurality of memory cells based on a counter reaching a trigger count value, the trigger count value selected from a plurality of different trigger count values based on a characteristic of the memory cells;
determine, based on the programmed states, first ones of the memory cells that do not satisfy a target threshold voltage; and
perform a programming pass on the first ones of the memory cells.

25. At least one article of manufacture of claim 24, wherein the instructions are further to cause the memory controller to determine a program pulse-type for use with the performing of the programming pass on the first ones of the memory cells, the program pulse-type determined based on analyzing the programmed states of the first ones of the memory cells relative to the target threshold voltage.

26. At least one article of manufacture of claim 25, wherein the program pulse-type is selected to be a full program pulse or a partial program pulse.

27. At least one article of manufacture of claim 24, wherein the instructions are further to cause the memory controller to:
determine, based on the programmed states, second ones of the memory cells that satisfy the target threshold voltage; and
inhibit the second ones of the memory cells from the programming pass based on ones of the programmed states corresponding to the second ones of the memory cells satisfying the target threshold voltage.

28. At least one article of manufacture of claim 24, wherein the instructions are further to cause the memory controller to start the counter in association with activating the plurality of memory cells.

29. At least one article of manufacture of claim 24, wherein the memory cells store multiple bits per memory cell.

30. At least one article of manufacture of claim 24, wherein the target threshold voltage is representative of data to be stored in the memory cells.

31. At least one article of manufacture of claim 24, wherein the memory cells are NAND flash memory.

32. A method to program memory cells, comprising:
determining programmed states of a plurality of memory cells based on a counter reaching a trigger count value;
associating ones of the memory cells with different regions of a soft bit range based on the programmed states; and
redefining boundary reference voltages of threshold voltage ranges corresponding to the memory cells based on a distribution of the ones of the memory cells across the regions of the soft bit range.

33. A method of claim 32, further including selecting the trigger count value from a plurality of different trigger count values based on a characteristic of the memory cells.

34. A method of claim 32, wherein the soft bit range is between first and second boundary reference voltages, the first boundary reference voltage to represent a first binary value, and the second boundary reference voltage to represent a second binary value.

35. A method of claim 34, wherein the redefining of the boundary reference voltages of the threshold voltage ranges aligns the ones of the memory cells with representing the first binary value or the second binary value.

36. A method of claim 32, further including starting the counter in association with activating the plurality of memory cells.

37. A method of claim 32, wherein the memory cells store multiple bits per memory cell.

38. A method of claim 32, wherein the memory cells are NAND flash memory.

39. An apparatus to program memory cells, comprising:
a programmed state detector to:
determine programmed states of a plurality of memory cells based on a counter reaching a trigger count value; and
associate ones of the memory cells with different regions of a soft bit range based on the programmed states; and
a circuit to redefine boundary reference voltages of threshold voltage ranges corresponding to the memory cells based on a distribution of the ones of the memory cells across the regions of the soft bit range.

40. An apparatus of claim 39, further including a trigger value retriever to select the trigger count value from a plurality of different trigger count values based on a characteristic of the memory cells.

41. An apparatus of claim 39, wherein the soft bit range is between first and second boundary reference voltages, the first boundary reference voltage to represent a first binary value, and the second boundary reference voltage to represent a second binary value.

42. An apparatus of claim 41, wherein the redefining of the boundary reference voltages of the threshold voltage ranges aligns the ones of the memory cells with representing the first binary value or the second binary value.

43. An apparatus of claim 39, wherein the circuit is to start the counter in association with activating the plurality of memory cells.

44. An apparatus of claim 39, wherein the memory cells store multiple bits per memory cell.

45. An apparatus of claim 39, wherein the memory cells are NAND flash memory.

* * * * *